(12) United States Patent
Garcia Granda et al.

(10) Patent No.: US 10,895,811 B2
(45) Date of Patent: Jan. 19, 2021

(54) METHODS AND PATTERNING DEVICES AND APPARATUSES FOR MEASURING FOCUS PERFORMANCE OF A LITHOGRAPHIC APPARATUS, DEVICE MANUFACTURING METHOD

(71) Applicant: ASML Netherlands B.V., Veldhoven (NL)

(72) Inventors: Miguel Garcia Granda, Veldhoven (NL); Elliott Gerard Mc Namara, Eindhoven (NL); Pierre-Yves Jerome Yvan Guittet, Veldhoven (NL); Eric Jos Anton Brouwer, Weert (NL); Bart Peter Bert Segers, Tessenderlo (BE)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/599,215

(22) Filed: Oct. 11, 2019

(65) Prior Publication Data
US 2020/0117101 A1    Apr. 16, 2020

(30) Foreign Application Priority Data
Oct. 12, 2018  (EP) .................................. 18200000

(51) Int. Cl.
*G03F 7/20* (2006.01)
(52) U.S. Cl.
CPC .......... *G03F 7/70625* (2013.01); *G03F 7/702* (2013.01); *G03F 7/7085* (2013.01);
(Continued)
(58) Field of Classification Search
CPC ............. G03F 7/70633; G03F 7/70641; G03F 7/70683
See application file for complete search history.

(56) References Cited

U.S. PATENT DOCUMENTS

| 10,551,308 B2 | 2/2020 | Jak et al. |
| 2002/0005496 A1 * | 1/2002 | Sakamoto ........... G03F 7/70558 250/548 |

(Continued)

FOREIGN PATENT DOCUMENTS

| TW | 201732266 A | 9/2017 |
| WO | WO 2013/178422 A1 | 12/2013 |

(Continued)

OTHER PUBLICATIONS

International Search Report and Written Opinion of the International Searching Authority directed to related International Patent Application No. PCT/EP2019/075899, dated Dec. 11, 2019; 14 pages.

*Primary Examiner* — Steven Whitesell Gordon
(74) *Attorney, Agent, or Firm* — Sterne, Kessler, Goldstein & Fox P.L.L.C.

(57) ABSTRACT

A lithographic apparatus prints a focus metrology pattern (T) on a substrate, the printed pattern including at least a first array of features (800). Features at any location within the array define a pattern that repeats at in at least a first direction of periodicity (X), while geometric parameters of the repeating pattern (w1, w3) vary over the array. A focus measurement is derived from measurements of the array at a selected subset of locations (ROI). As a result, the geometric parameters upon which the measurement of focus performance is based can be optimized by selection of locations within the array. The need to optimize geometric parameters of a target design on a reticle (MA) is reduced or eliminated. The measured property may be asymmetry, for example, and/or diffraction efficiency. The measured property for all locations may be captured by dark-field imaging, and a subset of locations selected after capture.

15 Claims, 12 Drawing Sheets

US 10,895,811 B2

Page 2

(52) U.S. Cl.
CPC ...... G03F 7/70525 (2013.01); G03F 7/70641 (2013.01); G03F 7/70683 (2013.01)

(56) References Cited

U.S. PATENT DOCUMENTS

| | | |
|---|---|---|
| 2006/0033921 A1 | 2/2006 | Den Boef et al. |
| 2006/0103823 A1* | 5/2006 | Yabe ................. G03F 7/705 355/55 |
| 2010/0201963 A1 | 8/2010 | Cramer et al. |
| 2010/0328655 A1 | 12/2010 | Den Boef |
| 2011/0027704 A1 | 2/2011 | Cramer et al. |
| 2011/0043791 A1 | 2/2011 | Smilde et al. |
| 2011/0069292 A1 | 3/2011 | Den Boef |
| 2011/0102753 A1 | 5/2011 | Van De Kerkhof et al. |
| 2011/0109888 A1* | 5/2011 | Van Der Schaar .................. G01N 21/95607 355/53 |
| 2012/0044470 A1 | 2/2012 | Smilde et al. |
| 2012/0123581 A1 | 5/2012 | Smilde et al. |
| 2013/0258310 A1 | 10/2013 | Smilde et al. |
| 2013/0271740 A1 | 10/2013 | Quintanilha |
| 2014/0375984 A1* | 12/2014 | Choi ................. G01N 21/93 356/73 |
| 2015/0293458 A1* | 10/2015 | Vanoppen ........... G03F 7/70558 355/53 |
| 2016/0103946 A1* | 4/2016 | El Kodadi ............ G06F 30/398 716/51 |
| 2016/0313656 A1* | 10/2016 | Van Dommelen .................. G03F 7/70641 |
| 2017/0153558 A1* | 6/2017 | Tel ..................... G03F 7/70683 |
| 2019/0171114 A1* | 6/2019 | Staals ................. G03F 7/70683 |

FOREIGN PATENT DOCUMENTS

| | | |
|---|---|---|
| WO | WO 2015/153497 A1 | 10/2015 |
| WO | WO 2017/198422 A1 | 11/2017 |
| WO | WO 2019/001873 A1 | 1/2019 |

\* cited by examiner

METHODS AND PATTERNING DEVICES AND APPARATUSES FOR MEASURING FOCUS PERFORMANCE OF A LITHOGRAPHIC APPARATUS, DEVICE MANUFACTURING METHOD

FIELD OF THE INVENTION

The present invention relates to inspection apparatus and methods usable, for example, to perform metrology in the manufacture of devices by lithographic techniques. The invention further relates to such methods for monitoring a focus parameter in a lithographic process, and to patterning devices for use in implementing the methods.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction "spectrum" from which a property of interest of the target can be determined.

Examples of known scatterometers include angle-resolved scatterometers of the type described in US2006033921A1 and US2010201963A1. The targets used by such scatterometers are relatively large, e.g., 40 µm by 40 µm, gratings and the measurement beam generates a spot that is smaller than the grating (i.e., the grating is underfilled). Diffraction-based overlay metrology using dark-field imaging of the diffraction orders enables measurement of overlay and other parameters on smaller targets. These targets can be smaller than the illumination spot and may be surrounded by product structures on a substrate. The intensities from the environment product structures can efficiently be separated from the intensities from the overlay target with the dark-field detection in the image plane.

Examples of dark-field imaging metrology can be found in international patent applications US20100328655A1 and US2011069292A1 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

One important parameter of a lithographic process which requires monitoring is focus. There is a desire to integrate an ever-increasing number of electronic components in an IC. To realize this, it is necessary to decrease the size of the components and therefore to increase the resolution of the projection system, so that increasingly smaller details, or line widths, can be projected on a target portion of the substrate. As the critical dimension (CD) in lithography shrinks, consistency of focus, both across a substrate and between substrates, becomes increasingly important. CD is the dimension of a feature or features (such as the gate width of a transistor) for which variations will cause undesirable variation in physical properties of the feature.

Traditionally, optimal settings were determined by "send-ahead wafers" i.e. substrates that are exposed, developed and measured in advance of a production run. In the send-ahead wafers, test structures were exposed in a so-called focus-energy matrix (FEM) and the best focus and energy (exposure dose) settings were determined from examination of those test structures. More recently, focus metrology targets are included in the production designs, to allow continuous monitoring of focus performance. These metrology targets should permit rapid measurements of focus, to allow fast performance measurement in high-volume manufacturing. Ideally, the metrology targets should be small enough that they can be placed among the product features without undue loss of space.

Known focus measuring techniques exploit the fact that focus-sensitive asymmetry can be introduced into structures printed in a resist layer by special design of the patterns so that defocus causes side-wall angles of photoresist lines to have different slopes. Asymmetry in a grating structure can be measured effectively using high-speed inspection apparatus such as a scatterometer, working at infrared, visible or ultraviolet radiation wavelengths. Current test structure designs and focus measuring methods have a number of drawbacks. Known focus metrology targets require sub-resolution features and/or grating structures with large pitches. Such structures may contravene design rules of the users of lithographic apparatuses.

For EUV lithography, where printing is performed using radiation of a wavelength less than 20 nm, for example 13.5 nm, the creation of sub-resolution features becomes even more difficult. For EUV lithography, resist thickness, and therefore the thickness of target structures, is smaller. This weakens the diffraction efficiency, and hence the signal strength, available for focus metrology. In international patent application PCT/EP2018/063959, not published at the priority date of the present application, several new designs for focus metrology targets are presented which can exhibit focus-dependent asymmetry without the need for sub-resolution features violating design rules. These are particularly useful for EUV lithography, but may also be applied in DUV lithography. The contents of the international patent application are hereby incorporated by reference in their entirety.

Nevertheless, the practical implementation of these techniques brings several challenges. Relying on defocus to cause side-wall angles of photoresist lines to have different slopes requires operation at the precise margins of the imaging capability of the lithographic apparatus and the resist. It is very difficult to select the target parameters based on computational simulation. Therefore, the way to select those parameters nowadays is to print all used combination of parameters and read them all from a product or test wafer. Based on those measurement, a particular design is selected to be placed on the product reticle. After this target is printed on the product wafers, a recipe optimization step is done in order to select the optimal focus metrology recipe for use at the measurement time. Moreover, for each product, and each layer within a product, a completely separate design and optimization process may be required, so that the target designs and metrology recipes are different for every reticle. This target selection procedure is therefore time consuming and requires specific wafers and actions from the customer. The design is fixed in the product reticle, and may become less than optimal as process conditions change.

For these reasons, there is a need to develop new techniques for the measurement of focus performance in lithographic processes, particularly in EUV lithography, but also for projection-based lithography in general.

SUMMARY OF THE INVENTION

The present invention aims to provide alternative methods of measuring focus performance.

The invention in a first aspect provides a method of measuring focus performance of a lithographic apparatus, the method comprising:

(a) receiving a substrate upon which a focus metrology pattern has been printed, the printed focus metrology pattern including at least a first array of features in which the features at any location within the array define a pattern that repeats in at least a first direction of periodicity, and at least one geometric parameter of the repeating pattern varies from location to location over the array;

(b) measuring a property of the printed focus metrology pattern at least at a selected subset of the locations across the array; and (c) deriving a measurement of focus performance from said property as measured at the selected subset of the locations measured across the array, whereby the repeating pattern upon which the measurement of focus performance is based has geometric parameters determined partly by selection of said subset of locations within the array.

The invention in a second aspect provides a patterning device for use in a lithographic apparatus, the patterning device comprising portions that define one or more device patterns and portions that define one or more metrology patterns, the metrology patterns including at least one focus metrology pattern, the focus metrology pattern comprising at least a first array of features in which the features at any location within the array define a pattern that repeats in at least a first direction of periodicity, and at least one geometric parameter of the repeating pattern varies from location to location over the array, whereby measurement of focus performance using repeating patterns having different geometric parameters can be performed by measuring a property of the printed focus metrology pattern using a selected subset of the locations across the array.

The invention in a third aspect provides a method of determining a metrology recipe for use in controlling a lithographic apparatus, the method comprising:

(a) receiving measurements of a property of a plurality of focus metrology patterns, said focus metrology pattern having been printed by a lithographic apparatus multiple times on one or more substrates with programmed focus offsets, the printed focus metrology pattern including at least a first array of features in which the features at any location within the array define a pattern that repeats in at least a first direction of periodicity, and at least one geometric parameter of the repeating pattern varies from location to location over the array, said measurements of the property having been made at multiple locations across the array of each printed focus metrology pattern; and (b) based on the property measured at the multiple locations and on knowledge of the focus offsets applied in printing each focus metrology pattern, determining an optimal subset of the locations measured across the array, and storing information identifying the selected subset as part of a metrology recipe to be used for measurement of focus performance on subsequent substrates undergoing similar processing.

The invention yet further provides metrology apparatus for measuring a focus performance of a lithographic process, the metrology apparatus being operable to perform steps (a) and (b) of the method according to the first aspect of the invention as set forth above.

The invention yet further provides apparatus for determining a metrology recipe, the metrology apparatus being operable to perform steps (a) and (b) of the method of the second aspect of the invention as set forth above.

The invention yet further provides a lithographic system comprising a lithographic apparatus comprising:

an illumination optical system arranged to illuminate a patterning device;

a projection optical system arranged to project an image of the patterning device onto a substrate; and a metrology apparatus according to the invention as set forth above, wherein the lithographic apparatus is arranged to use the measurement of focus performance derived by the metrology apparatus when applying the pattern to further substrates.

The invention yet further provides computer program products for use in implementing methods and apparatuses according to various aspects of the invention as set forth above. The computer program product may comprise instructions stored on a non-transitory medium.

The invention yet further provides a method of manufacturing devices using any of the methods according to the invention as set forth above.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXEMPLARY EMBODIMENTS

Before describing embodiments of the invention in detail, it is instructive to present an example environment in which embodiments of the present invention may be implemented. As an example, an EUV lithography environment will be described, but the techniques disclosed herein are applicable equally in other types of lithography.

Figure 1:
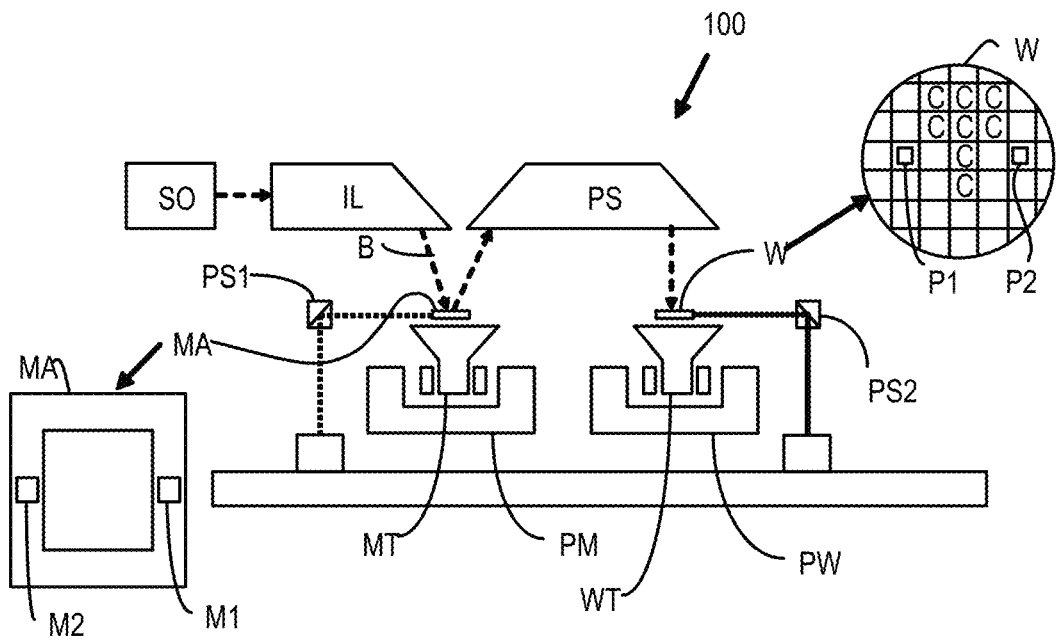
FIG. 1 depicts a lithographic apparatus having (in this example) a reflective patterning device.

FIG. 1 schematically depicts a lithographic apparatus 100 including a source module SO according to one embodiment of the invention. The apparatus comprises:

an illumination system (illuminator) IL configured to condition a radiation beam B (e.g. EUV radiation).

a support structure (e.g. a mask table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

In general patterning devices used in lithography may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask). The focus metrology techniques of the present disclosure have been developed particularly for use with reflective patterning devices (reticles), where illumination is not in a direction normal to a plane of the patterning device surface, but at a slightly oblique angle. In principle, the same techniques could apply in relation to a transmissive patterning device, if for some reason illumination introduced asymmetry. Conventionally, illumination of the reticle is designed to be symmetrical, but with reflective reticles, that is not generally possible.

Certain embodiments of the present disclosure exploit asymmetry in the projection system using a reflective patterning device. Other embodiments are applicable with any kind of projection system.

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source module. The laser and the source module may be separate entities, for example when a CO2 laser is used to provide the laser beam for fuel excitation.

In such cases, the laser is not considered to form part of the lithographic apparatus and the radiation beam is passed from the laser to the source module with the aid of a beam delivery system comprising, for example, suitable directing mirrors and/or a beam expander. In other cases, the source may be an integral part of the source module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

It will be understood that the lithographic apparatus is represented in FIG. 1 in a highly schematic form, but that is all that is necessary for the present disclosure.

Figure 2:
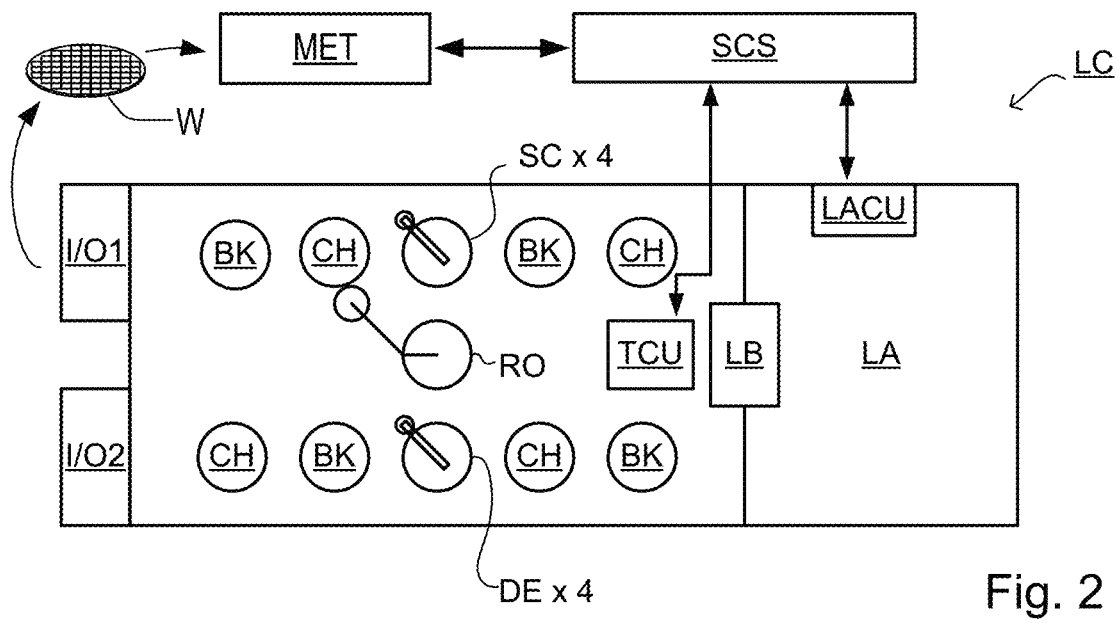
FIG. 2 depicts a lithographic cell or cluster in which a lithographic apparatus and metrology apparatus can be used to perform methods according to the present invention.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly, a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates, especially if the inspection can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatuses have sufficient sensitivity to make useful measurements of the latent image. Therefore, measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3A:
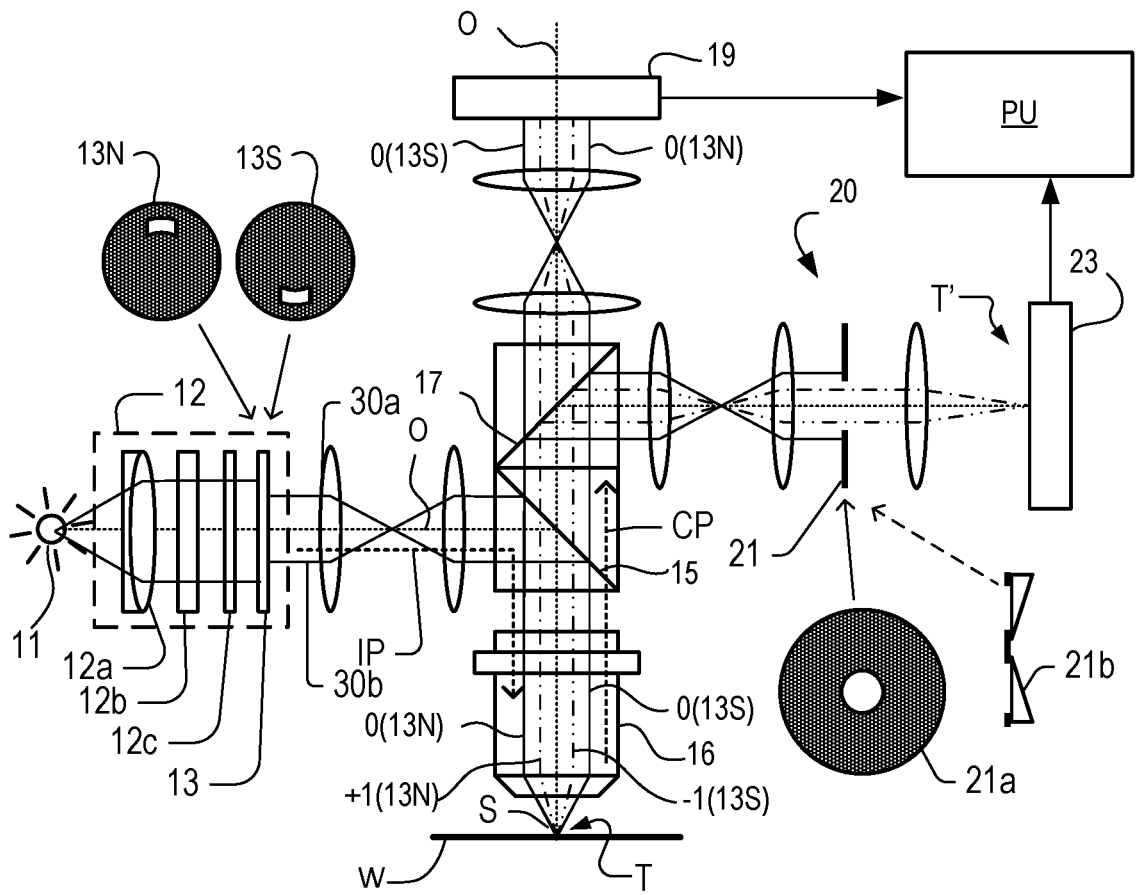
FIGS. 3(a) and 3(b) illustrate schematically an inspection apparatus adapted to perform angle-resolved scatterometry and dark-field imaging inspection methods.

FIG. 3(a) shows schematically the key elements of an inspection apparatus implementing so-called dark field imaging metrology. The apparatus may be a stand-alone device or incorporated in either the lithographic apparatus LA, e.g., at the measurement station, or the lithographic cell LC. An optical axis, which has several branches throughout the apparatus, is represented by a dotted line O. A target grating structure T and diffracted rays are illustrated in more detail in FIG. 3(b).

As described in the prior applications cited in the introduction, the dark-field imaging apparatus of FIG. 3(a) may be part of a multi-purpose angle-resolved scatterometer that may be used instead of or in addition to a spectroscopic scatterometer. In this type of inspection apparatus, radiation emitted by a radiation source 11 is conditioned by an illumination system 12. For example, illumination system 12 may include a collimating lens system, a color filter, a polarizer and an aperture device 13. The conditioned radiation follows an illumination path IP, in which it is reflected by partially reflecting surface 15 and focused into a spot S on substrate W via a microscope objective lens 16. A metrology target T may be formed on substrate W. Lens 16, has a high numerical aperture (NA), preferably at least 0.9 and more preferably at least 0.95. Immersion fluid can be used to obtain with numerical apertures over 1 if desired.

The objective lens 16 in this example serves also to collect radiation that has been scattered by the target. Schematically, a collection path CP is shown for this returning radiation. The multi-purpose scatterometer may have two or more measurement branches in the collection path. The illustrated example as a pupil imaging branch comprising pupil imaging optical system 18 and pupil image sensor 19. An imaging branch is also shown, which will be described in more detail below. Additionally, further optical systems and branches will be included in a practical apparatus, for example to collect reference radiation for intensity normalization, for coarse imaging of capture targets, for focusing and so forth. Details of these can be found in the prior publications mentioned above.

Where a metrology target T is provided on substrate W, this may be a 1-D grating, which is printed such that after development, the bars are formed of solid resist lines. The target may be a 2-D grating, which is printed such that after development, the grating is formed of solid resist pillars or vias in the resist. The bars, pillars or vias may alternatively be etched into the substrate. Each of these gratings is an example of a target structure whose properties may be investigated using the inspection apparatus.

The various components of illumination system 12 can be adjustable to implement different metrology 'recipes' within the same apparatus. In addition to selecting wavelength (color) and polarization as characteristics of the illuminating radiation, illumination system 12 can be adjusted to implement different illumination profiles. The plane of aperture device 13 is conjugate with a pupil plane of objective lens 16 and the plane of the pupil image detector 19. Therefore, an illumination profile defined by aperture device 13 defines the angular distribution of light incident on substrate W in spot S. To implement different illumination profiles, an aperture device 13 can be provided in the illumination path. The aperture device may comprise different apertures mounted on a movable slide or wheel. It may alternatively comprise a programmable spatial light modulator. As a further alternative, optical fibers may be disposed at different location in the illumination pupil plane and used selectively to deliver light or not deliver light at their respective locations. These variants are all discussed and exemplified in the documents cited above.

Figure 3B:
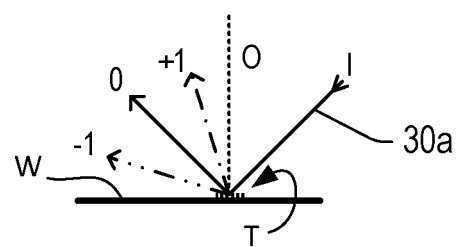

In a first example illumination mode, aperture 13N is used and rays 30a are provided so that the angle of incidence is as shown at 'I' in FIG. 3(b). The path of the zero order ray reflected by target T is labeled '0' (not to be confused with optical axis 'O'). In a second illumination mode, aperture 13S is used, so that rays 30b can be provided, in which case the angles of incidence and reflection will be swapped compared with the first mode. In FIG. 3(a), the zero order rays of the first and second example illumination modes are labeled 0(13N) and 0(13S) respectively. Both of these illumination modes will be recognized as off-axis illumination modes. Many different illumination modes, including on-axis illumination modes can be implemented for different purposes.

As shown in more detail in FIG. 3(b), target grating T as an example of a target structure is placed with substrate W normal to the optical axis O of objective lens 16. In the case of an off-axis illumination profile, a ray of illumination I impinging on grating T from an angle off the axis O gives rise to a zeroth order ray (solid line 0) and two first order rays (dot-chain line +1 and double dot-chain line −1). It should be remembered that with an overfilled small target grating, these rays are just one of many parallel rays covering the area of the substrate including metrology target grating T and other features. Since the beam of illuminating rays 30a has a finite width (necessary to admit a useful quantity of light), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown.

In the branch of the collection path for dark-field imaging, imaging optical system 20 forms an image T' of the target on the substrate W on sensor 23 (e.g. a CCD or CMOS sensor).

An aperture stop 21 is provided in a plane in the imaging branch of the collection path CP which is conjugate to a pupil plane of objective lens 16. Aperture stop 20 may also be called a pupil stop. Aperture stop 21 can take different forms, just as the illumination aperture can take different forms. The aperture stop 21, in combination with the effective aperture of lens 16, determines what portion of the scattered radiation is used to produce the image on sensor 23. Typically, aperture stop 21 functions to block the zeroth order diffracted beam so that the image of the target formed on sensor 23 is formed only from the first order beam(s). In an example where both first order beams are combined to form an image, this would be the so-called dark field image, equivalent to dark-field microscopy. As an example of an aperture stop 21, aperture 21a can be used which allows passage of on-axis radiation only. Using off-axis illumination in combination with aperture 21a, only one of the first orders is imaged at a time.

The images captured by sensor 23 are output to image processor and controller PU, the function of which will depend on the particular type of measurements being performed. For the present purpose, measurements of asymmetry of the target structure are performed. Asymmetry measurements can be combined with knowledge of the target structures to obtain measurements of performance parameters of lithographic process used to form them. Performance parameters that can be measured in this way include for example overlay, focus and dose. Special designs of targets are provided to allow these measurements of different performance parameters to be made through the same basic asymmetry measurement method.

Referring again to FIG. 3(b) and the first example illumination mode with rays 30a, +1 order diffracted rays from the target grating will enter the objective lens 16 and contribute to the image recorded at sensor 23. When the second illumination mode is used, rays 30b are incident at an angle opposite to rays 30b, and so the −1 order diffracted rays enter the objective and contribute to the image. Aperture stop 21a blocks the zeroth order radiation when using off-axis illumination. As described in the prior publications, illumination modes can be defined with off-axis illumination in X and Y directions.

By comparing images of the target grating under these different illumination modes, asymmetry measurements can be obtained. Alternatively, asymmetry measurements could be obtained by keeping the same illumination mode, but rotating the target. While off-axis illumination is shown, on-axis illumination of the targets may instead be used and a modified, off-axis aperture 21 could be used to pass substantially only one first order of diffracted light to the sensor. In a further example, a pair of off-axis prisms 21b are used in combination with an on-axis illumination mode. These prisms have the effect of diverting the +1 and −1 orders to different locations on sensor 23 so that they can be detected and compared without the need for two sequential image capture steps. This technique is disclosed in the above-mentioned published patent application US2011102753A1, the contents of which are hereby incorporated by reference. 2nd, 3rd and higher order beams (not shown in FIG. 3) can be used in measurements, instead of or in addition to the first order beams. As a further variation, the off-axis illumination mode can be kept constant, while the target itself is rotated 180 degrees beneath objective lens 16 to capture images using the opposite diffraction orders.

Diffraction Based Focus Metrology Introduction

In the following disclosure, techniques will be illustrated for measuring focus performance of a lithographic process. Metrology targets including certain focus metrology patterns will be printed on the substrate, at the same time as product features are printed. Asymmetry in these printed patterns will be measured using for example diffraction based techniques in the apparatus of FIG. 3. It will be assumed that these asymmetry measurements will be performed using the dark-field imaging branch of the apparatus. Diffraction-based measurements of asymmetry can also be made using the pupil imaging branch, however, and with other forms of apparatus. Of course, the apparatus shown in FIG. 3 is only one example of an inspection apparatus and method that may be used to measure asymmetry.

In the context of lithographic apparatuses working in the DUV wavelength range, targets for diffraction-based focus (DBF) measurements have been designed and used successfully. A known type of DBF target is produced by including sub-segmented features in a grating pattern on the reticle. In a first type of DBF target, these features have dimensions below the imaging resolution of the lithographic apparatus, alongside more solid features. Consequently, they do not print as individual features in the resist layer on the substrate, but they influence the printing of the solid features, in a manner that is sensitive to focus error. Specifically, the presence of these features creates an asymmetric resist profile for each line in the grating within the DBF metrology target, with the degree of asymmetry being dependent upon focus. Consequently, a metrology tool such as the inspection apparatus of FIG. 3 can measure the degree of asymmetry from a target formed on the substrate, and translate this into the scanner focus.

Unfortunately, the known DBF metrology target designs are not suitable for use in all situations. In EUV lithography, resist film thicknesses are significantly lower than those used in DUV immersion lithography, leading to low diffraction efficiency and difficulty extracting accurate asymmetry information from diffracted radiation in the scatterometer. In addition, to provide sub-resolution features on a reticle may be rather impractical, and/or may violate semiconductor manufacturer's "design rules". Such rules are generally established as a means to restrict the feature designs to ensure the printed features conform to their process requirements. In any case, when trying to exploit the limits of the imaging system to obtain a usable and predictable focus-dependent asymmetry, the optimum target design and the calibration of focus measurements becomes a matter of trial-and-error. The desire to conform to design rules applies to DBF targets in DUV lithography, not only EUV lithography. The principles of the present disclosure can be applied equally in conventional DBF targets having sub-resolution features, or in target designs which do not includes features below the printing resolution.

The following examples include various focus metrology patterns that may be used as the basis for implementation of the present invention, and of course other examples can be envisaged, based on the principles disclosed herein. In general in the examples, only a small section of the repeating pattern 400 is shown in detail, including a repeating unit 402 having features whose dimensions are defined by various geometric parameters.

Figure 4A:
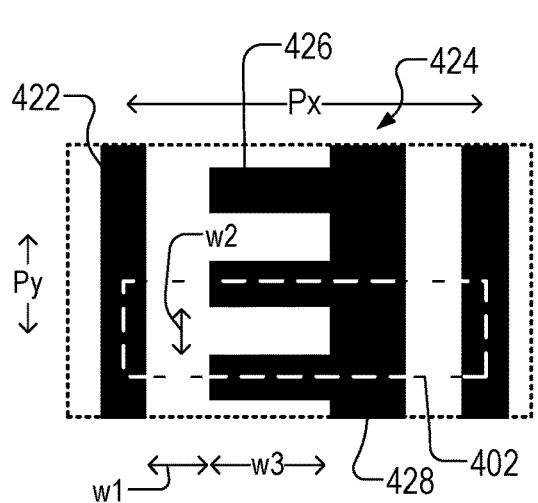
FIGS. 4(a)-4(b) illustrate part of a repeating pattern in an array of features forming an example focus metrology pattern, and showing variation of geometric parameters of the repeating pattern between examples 4(a) and 4(b), the design being one of the examples described in the above-mentioned international patent application PCT/EP2018/063959, not published at the priority date of the present application.

FIG. 4 (a) and (b) show different variants of the same basic design of repeating pattern. in isolation a small portion of the same focus metrology pattern that is used as the example in FIG. 4. The repeating unit 402 of this pattern comprises one first feature 422 and one second feature 424, spaced from each other by a distance w1 in a first direction of periodicity. The first direction of periodicity in this example is the X direction of the patterning device and substrate. The repeating unit 402 has a first dimension Px corresponding to the period (pitch) of the repeating pattern in the first direction of periodicity, and a second dimension Py corresponding to the period (pitch) of the repeating pattern (if any) in a second direction of periodicity. Each second feature in the repeating pattern of this example further includes sub-features 426 having a dimension w2 in the second direction of periodicity (Y). The sub-features in this example are lines projecting asymmetrically from a main body 428 of the first feature. The length of these projecting lines or fingers is labelled w3. A minimum dimension of the features in this pattern is close to but not less than a resolution limit of the printing step, so that design rules need not be violated.

Figure 4B:
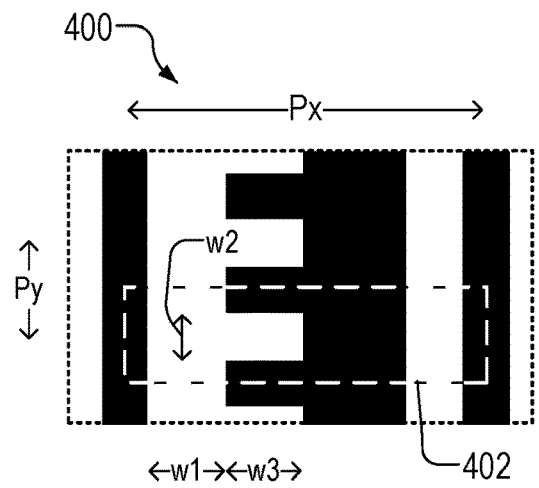

The dimensions Px, Py, w1, w2, w3 are examples of geometric parameters defining the repeating pattern, and several other parameters may be required to define the pattern completely, depending on its form, and any constraints placed on the design. As seen in FIG. 4(b), the parameters of the focus metrology pattern can be adjusted as part of a design process for an optimal focus metrology pattern. In the example, the parameters w1 and w3 have been altered, while w2 and the pitch parameters Px, Py remain the same as in FIG. 4(a). The optimal focus metrology pattern may be different for each layer and each process of a product, particularly where operating parameters of the lithographic apparatus may be customized for each layer. Design parameters may be expressed in any suitable format. Ratios may be convenient for expressing relative dimensions of features, while absolute dimensions may be expressed directly, or by ratios relative to a specified resolution limit, and/or relative to the period Px or Py.

The pitch Px is key to the diffraction which is exploited in the scatterometer, and is typically of the same order as the wavelength of radiation used in the measurement, and much greater than the resolution of the printing step. The value of Px may be for example 450 nm or 600 nm. The transverse pitch Py will typically be much smaller, for example 70 nm, and may be closer to the printing resolution of the printing step. None of the repeating units and repeating patterns in the present disclosure are intended to be drawn to scale. Note that each pattern can be seen in both positive (black on white) and negative (white on black) versions at the same time. of a particular design may be defined by reference to the positive or negative features, or a mixture of both. Depending on the chosen design parameters, the dimensions of the positive and negative versions may be identical (but in mirror image), or different.

Any of the parameters not varied in the examples of FIG. 4 can be varied. For example, the main pitch Px and/or the transverse pitch Py can be varied.

The circumstances under which each variant will work better or worse than another depend on the process, and the design is therefore to be optimized by use of simulation and/or experiment. Depending on the lithographic projection system, and also depending on chosen modes of illumination, for example, the resolution limit of the printing step in one direction may be different from the resolution limit in another direction. This difference, where it exists, can be taken into account in the setting of the different parameters, and in the interpretation of the language of the claims. Bipolar illumination modes are sometimes chosen, for example, specifically to enhance resolution in one direction preferentially over the other.

While targets including the above focus metrology target patterns may yield focus measurements (when appropriately designed for the process), there is also an expectation that the focus measurement of a target will be subject to uncertainty because of the wide variety of aberrations that can be introduced, besides focus. Accordingly, embodiments of the measurement method are also disclosed in which multiple differential measurements are made on two or more focus metrology patterns. These may be provided in pairs, with mirrored asymmetry in their designs, and/or in pairs with design differences other than mirror symmetry.

Figure 5:
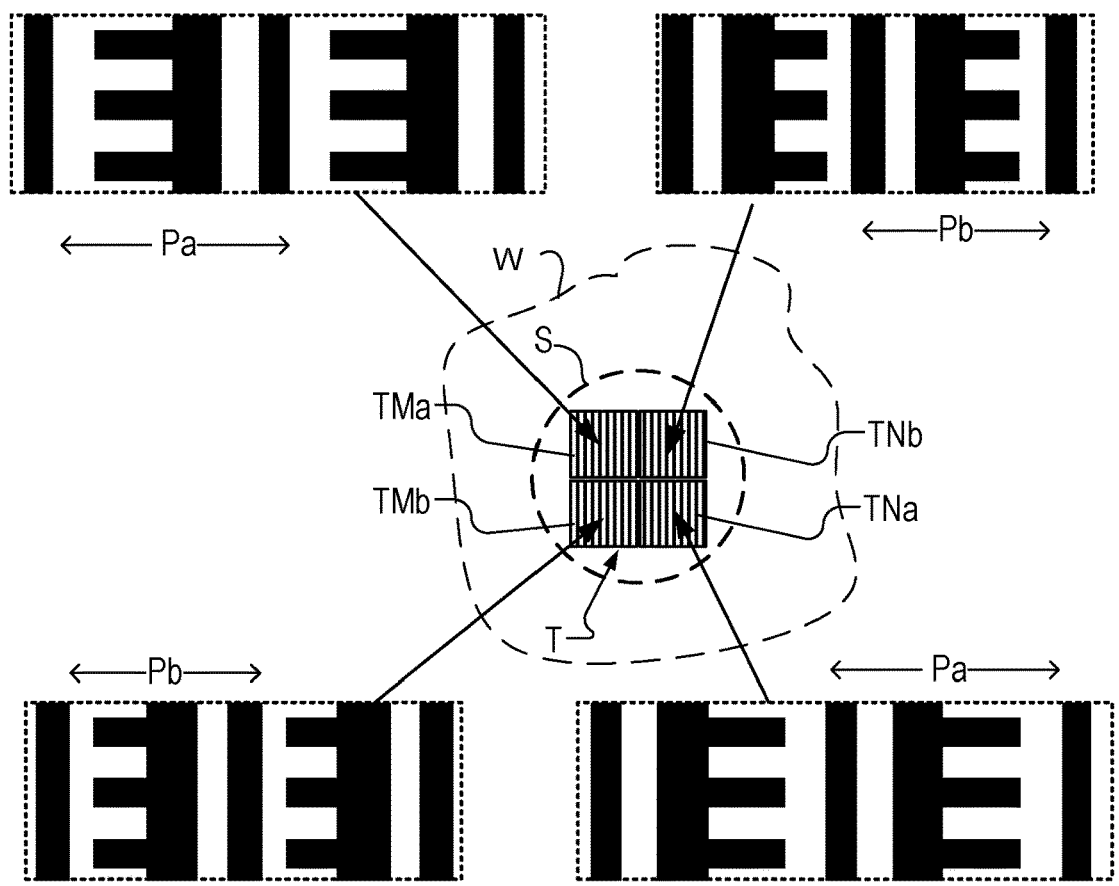
FIG. 5 shows the formation of a composite focus metrology target comprising four arrays of features based on variations of the repeating pattern shown in FIG. 4, and including mirrored pairs of arrays.

FIG. 5 shows the printing of two or more complementary patterns side by side on a substrate W, forming a composite focus metrology target T in an example taken from the above-mentioned international patent application. In this particular example, there are four focus metrology patterns, arranged in two complementary pairs TNa/TMa and TNb/TMb. In each complementary pair, the first pattern (printed on the right) is labeled TN (using N for 'normal') while the second pattern is printed on the left and labeled TM (M for 'mirror'). It will be understood that the labels are arbitrary, but the effect is that the printed focus metrology pattern comprises at least first and second periodic arrays of features, each periodic array of features forming an individual focus metrology pattern. Sections of the repeating pattern within each periodic array are shown enlarged around the drawing. It will be seen that the examples are all of the general types shown in FIG. 4, but with variation of geometric parameters and with mirror symmetry. There is then a programmed asymmetry within each periodic array, the asymmetry of the second periodic array being opposite to that of the first periodic array, to form a mirrored pair. To obtain an improved focus measurement then includes measuring asymmetry of each of the first and second periodic arrays and determining a measure of focus performance by combining the asymmetries measured for the periodic arrays (TN, TM).

By combining results from measurements using targets that have opposite asymmetries in their designs, the focus measurement can be made less sensitive to asymmetries that arise in the projection system or the metrology system, that otherwise might be mistaken for focus error. Particular types of imperfection that can be discriminated using a complementary pair of patterns in this way are coma and projection asymmetry. For example, coma may be expected to introduce asymmetry in a particular direction, when the image is defocused. By contrast, the asymmetry induced by focus error will be opposite in the "mirrored" pattern compared with the "normal" pattern. Combining the asymmetry measurements from both allows the actual focus error to be more accurately measured.

Additionally, in this example, two pairs of targets are provided, identified by the suffixes 'a' and 'b'. Between these pairs, the geometric parameters of the focus metrology patterns are varied. As a first difference, the period Pa of the pair TNa/TMa is longer than the period Pb of the pair TNb/TMb, and lengths of the "fingers" have been shortened. In other embodiments, different parameters could be varied, and the periods could be the same or different. Alternatively or in addition to providing different pattern designs, different capture conditions can also be used to obtain more diverse signals. For example, different wavelengths and/or polarizations of radiation can be used to obtain diffraction signals.

Figure 6:
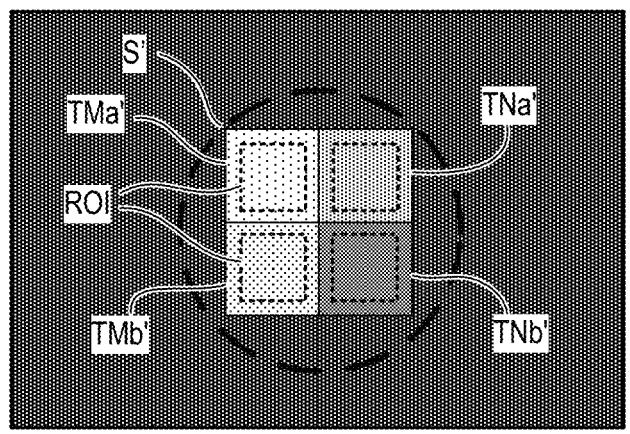
FIG. 6 shows schematically a dark-field image of the focus metrology patterns of the target of FIG. 5, obtained using the apparatus of FIG. 3.

As illustrated in FIG. 5, therefore, a composite focus metrology target T can be formed by one or more complementary pairs focus metrology patterns TN and TM being printed in the same step. As illustrated, these individual patterns may be imaged simultaneously using radiation spot S in the dark field imaging mode of the inspection apparatus of FIG. 3. In other words, measurements of asymmetry in both of these focus metrology patterns can be taken by taking first and second images using the +1 and −1 order diffracted radiation collected by the apparatus. One such image is shown in FIG. 6. The dark rectangle represents the dark-field image as recorded on sensor 23 in the apparatus of FIG. 3, for example. A circle S' indicates the area of radiation spot S, imaged onto the detector. Brighter rectangles TNa', TNb', TMa' and TMb' represent the images of the corresponding focus metrology patterns TNa, TNb, TMa and TMb, respectively. The intensity of one diffraction order from each target can be measured by, for example, defining a region of interest ROI within each of the brighter rectangles, and averaging the pixel values. Repeating this for the opposite diffraction order allows asymmetry to be calculated. In an alternative measurement method using the prisms 21b shown in FIG. 3, then effectively both images of both patterns can be captured simultaneously.

Figure 7:
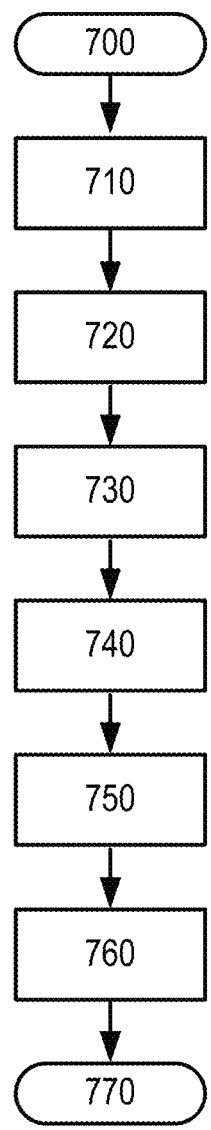
FIG. 7 is a flowchart of a method of monitoring focus according to an embodiment of the above-mentioned PCT/EP2018/063959.

FIG. 7 is a flowchart of the steps of a method for measuring focus performance of a lithographic process according to an exemplary embodiment. The method can be performed using any of the example focus metrology patterns described above and illustrated in the drawings. The steps are briefly summarized as follows, and are then described in greater detail in the above-mentioned international patent application:

700—Start by defining a product design or metrology wafer design with metrology targets, and preparing a suitable set of patterning devices (reticles). In advance of production, make exposures with known focus-exposure variations and measure these to obtain one or more calibration curves. (This may involve an iterative loop of design, exposure and measurement steps.)

710—Print one or more focus metrology patterns alongside product patterns on a substrate;

720—Measure intensity of a portion of the diffraction spectrum of each focus metrology pattern using a suitable inspection apparatus (for example the +1 order is a suitable portion of the diffraction spectrum);

730—Measure intensity of an opposite portion of the diffraction spectrum (for example, −1 order) of each focus metrology pattern using the inspection apparatus;

740—Calculate measurements of asymmetry of one or more focus metrology patterns by comparing the intensities of the opposite diffraction orders;

750—Using the asymmetry measurements, with the calibration curves stored in step 700 and/or other measurements such as SEM, calculate focus error at the time of printing the focus metrology pattern.

760—Use the derived focus measurement in focus setting for exposures on subsequent substrates.

770—End or repeat.

The above method allows measuring scanner focus on product wafers in high-volume manufacturing environment. However, as mentioned in the introduction, the targets that are placed on the product reticles need to be tuned specifically for the particular stack on which they will be used. ("Stack" is a convenient term referring to a particular set of underlying layers with associated patterning and processing history.) In order to tune the targets, a set of parameters can be changed, as shown in FIG. 4. Due to the nature of DBF targets, in which defocus causes side-wall angles of photoresist lines to have different slopes, it is very difficult to select the target parameters based on computational simulation. Therefore, the way to select those parameters nowadays is to print all used combination of parameters and read them all from a product or test wafer.

Based on those measurement, a composite target is selected to be placed on the product reticle. After this target is printed on the product wafers, a recipe optimization step is needed in order to select the optimal acquisition settings. For design such as the one shown in FIG. 4, even with constraints such as the quality of the black-and-white patterns, and only a few values for each geometric parameter, there may be many hundreds of permutations of parameters.

This target selection procedure is therefore time consuming and requires specific wafers and actions from the customer. The target selection procedure needs to be repeated in principle for each layer of a product, and for each product which a manufacture may wish to produce. Additionally, although the optimization steps can be repeated, and the measurement recipe adjusted to maintain measurement performance under new conditions, the parameters of the design of the target will be fixed on the reticle, unless and until a new reticle is prepared, with associated expense.

Diffraction Based Focus Metrology with Progressive Target

The present disclosure aims at simplifying, or even eliminating completely, the target selection step by using a reduced set of target designs, or even a single target design, that can always be printed and used in a wide range of product stacks.

In some embodiments, the aspects of the present disclosure include:

1. A new progressive target type to be measured with an image-plane imaging method. This target is meant to be used in a wide range of stacks without the need for a target selection specific to each stack.

2. A method to perform a recipe optimization with such a target, for example using a scatterometer of the type shown in FIG. 3, or similar.

3. A measurement mode using dark-field imaging with variable regions of interest (ROI) for the progressive target.

Figure 8A:
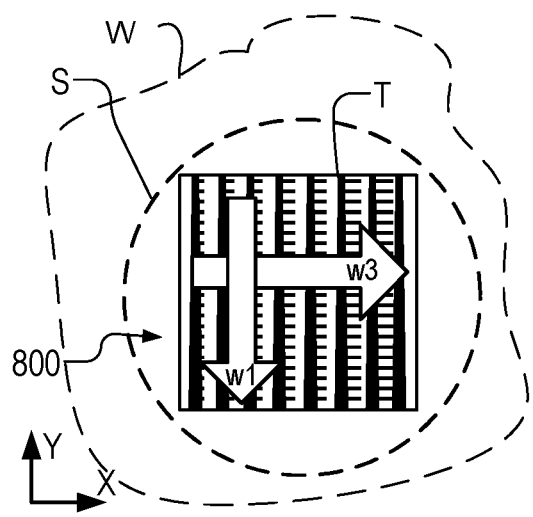
FIGS. 8(a)-8(b) show 8(a) a focus metrology target comprising a single array of features including two-dimensional variation of geometric parameters in a repeating pattern, according to a first embodiment of the present invention based on, and 8(b) a dark-field image of the focus metrology patterns of the target of FIG. 5, obtained using the apparatus of FIG. 3.

As shown in FIG. 8(a), the focus metrology target T according to some embodiments of the present disclosure includes at least a first array 800 of features in which the features at any location within the array define a pattern that repeats in at least a first direction of periodicity, and at least one geometric parameter of the repeating pattern varies from location to location over the array.

The form of the repeating pattern within the array of features could be any of the examples used for DBF, including the examples described in the international patent application, mentioned above. In the example of FIG. 8(a), the pattern is similar locally to the one shown in FIGS. 4 and 5, it being understood that the features are not to scale, and the real target would have many more lines. However, rather than four targets each having defined values for the geometric parameters of the repeating pattern, the progressive target has (in this example) parameters w1 and w3 varying continuously, or at least progressively, from location to location over the whole array. Two parameters vary in two directions in the illustrated example. In other embodiments, one or more parameters may vary in only one direction. Further examples will be shown and described below.

Also shown in FIG. 8(a) is a radiation spot S of the scatterometer, which is, for the sake of example, making dark-field measurements of asymmetry of the target. Assuming that the size of the spot is the same as in FIG. 6, it will be appreciated that the array of features 800 covers an area larger than the individual targets of FIG. 5. For example, instead of four targets each 10×10 µm square, the target of FIG. 8 may be a square of sized 20×20 µm.

Figure 8B:
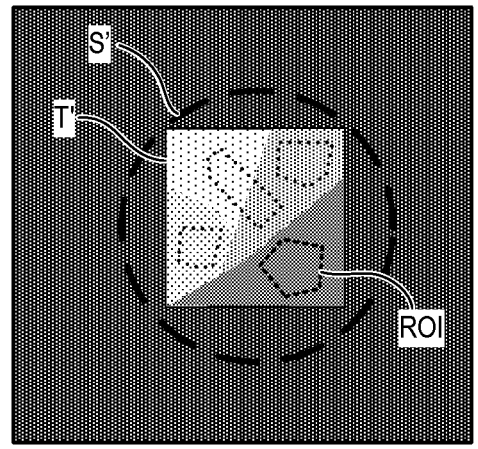

FIG. 8(b) shows the resulting dark-field image, when the array 800 is measured.

Instead of four individual target areas, a single image area T' can be seen, with pixel intensities that vary continuously, according to the different response of the repeating pattern, as the parameters w1 and w3 vary across the array. Example region of interest ROI is outlined, comprising a subset of the locations across the array. It will be understood that within this ROI, the diffraction signals come from a repeating pattern having particular values of the geometric parameters, different from other locations within the target image T'. Accordingly, other regions of interest, such as the ones shown dotted in FIG. 8(b), comprise locations having a similar repeating pattern, but with different values of the geometric parameters.

A focus metrology method using the progressive target includes measuring a property or properties of the printed focus metrology pattern (for example asymmetry and/or diffraction efficiency) at least at a selected subset of the locations across the array. A measurement of focus performance is then derived from said property as measured at the selected subset of the locations measured across the array. In this way, the repeating pattern upon which the measurement of focus performance is based has geometric parameters determined partly by selection of said subset of locations within the array. That is to say, the geometric parameters of the target used for the measurement of focus performance can be selected after the target has been printed. Accordingly, there is no need to select the parameters by a time-consuming and uncertain process, before committing the design to a patterning device.

Figure 9:
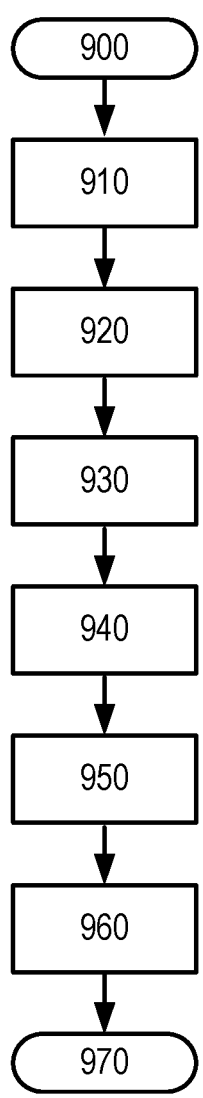
FIG. 9 is a flowchart of a method of monitoring focus according to an embodiment of the present invention.

FIG. 9 is a flowchart of the steps of a method for measuring focus performance of a lithographic process using a progressive focus metrology pattern. The steps are as follows, and are then described in greater detail thereafter:

900—Start by defining a product design or metrology wafer design with one or more progressive metrology targets, and preparing a suitable set of patterning devices (reticles).

910—Print one or more progressive focus metrology targets alongside product patterns on a substrate;

920—Measure intensity of a portion of the diffraction spectrum of each metrology target using a suitable inspection apparatus (for example the +1 order is a suitable portion of the diffraction spectrum);

930—Measure intensity of an opposite portion of the diffraction spectrum (for example, −1 order) of each focus metrology pattern using the inspection apparatus;

940—Calculate measurements of asymmetry of one or more focus metrology patterns by comparing the intensities of the opposite diffraction orders, using only a selected subset of locations (ROI) over the target image T', the selected subset of locations being defined along with other capture conditions as part of a focus metrology recipe;

950—Using the asymmetry measurements, with stored calibration curves and/or other measurements such as SEM, calculate focus error at the time of printing the focus metrology pattern.

960—Use the derived focus measurement in focus setting for exposures on subsequent substrates.

970—End or repeat with further substrates.

As already explained with reference to FIG. 3, step 920 and step 930 may be performed as a single step such that the opposite diffraction orders of a focus metrology pattern can be obtained in a single acquisition.

Additionally, it should be understood that asymmetry is only one example of a property of the target that can be measured and used to obtain the focus measurement. Simple intensity of the image provides information on diffraction efficiency, which is also related to the quality of the printed pattern. Accordingly, an "Bossung-like" behavior may be observed in the intensity of the diffracted radiation across a region of the target. This intensity may be obtained by averaging the intensity of the opposite diffraction orders, while asymmetry is calculated from the difference. In principle, the diffraction efficiency can be measured without the need to measure separately the opposite diffraction orders. In further embodiments, asymmetry measurements from a region of interest at one part of the target may be combined with intensity measurements in a different region of interest on the same target, to obtain complete measurement. Alternatively or in addition, asymmetry measurements obtained under one set of illumination conditions may be combined with intensity measurements made under another set of illumination conditions, to obtain complete measurement. It may be, for example, that the asymmetry-based measurements give good information about the sign of the focus, but not its magnitude, while the intensity measurements give better information about the magnitude of the defocus. By combining these two types of information from one or more targets, a more accurate measurement can be obtained.

Although the measurement steps are shown being made by a scatterometer, as a dedicated inspection apparatus, this may be a stand-alone apparatus, or it may be integrated in the lithocell. Moreover, asymmetry measurements can be made without dedicated metrology apparatus, for example using suitable targets with the alignment sensors provided in the lithographic apparatus. In principle, intensities are only required at the subset of locations that are going to be used in calculating the measurement of focus performance. When using dark-field imaging with an image field large enough that the entire array can be captured without any time penalty, it will be more convenient to capture the whole image and select the data later.

Calculation steps 940 and 950 can all be performed in a processor of the inspection apparatus, or may be performed in different processors associated with monitoring and control of the lithographic apparatus. Each step may be performed by a programmed processor, and it is an advantage of the techniques disclosed, that the inspection apparatus can be modified to perform the focus measurement methods without hardware modification.

Comparing the method of FIG. 9 with the known DBF methods, the benefit of using the progressive target is that the traditional target selection step, before any design is committed to the reticle, can be skipped, or at least reduced to selecting from a few generic target designs. It may be, for example, that different progressive target designs are suited to different categories of products and processes, for example broad categories of DRAM products, or ROM products, or logic products. However, the step of selecting and optimizing the target design for every layer of every individual product is avoided. In principle, the same progressive target (or targets) is always printed. Selection of target parameters is effectively deferred until after the targets are printed.

Figure 10:
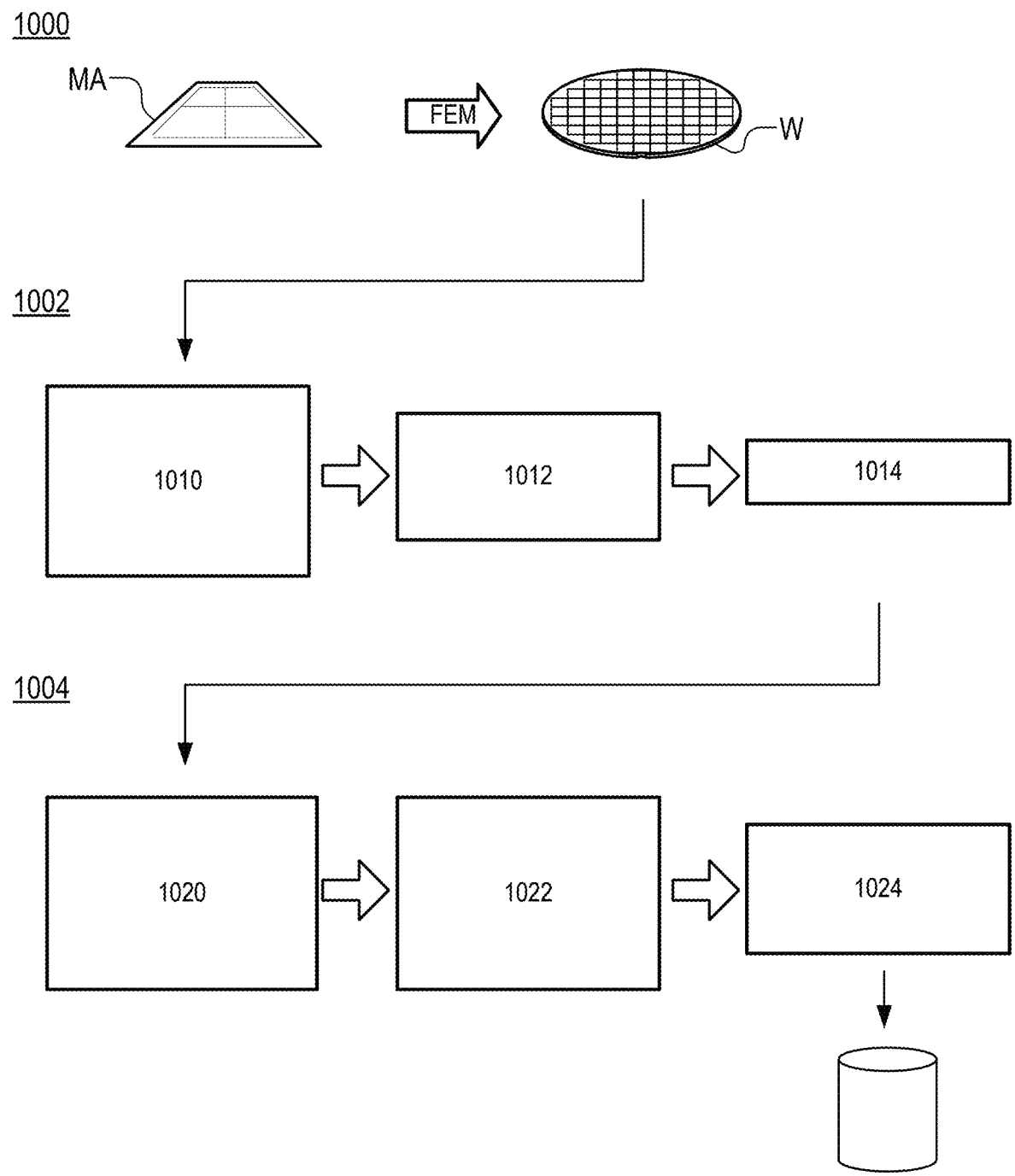
FIG. 10 shows a method of obtaining a focus metrology recipe in an embodiment of the present invention.

FIG. 10 illustrates the general flow of one example of an optimization process to select the best image capture conditions and signal extraction for each case. As a first step 1000, the reticle or other patterning device MA having on it one or more of the progressive focus metrology patterns, is used to apply patterns to one or more calibration wafers W. These calibration wafers are exposed using the traditional focus-exposure matrix (FEM) technique, in which different fields are exposed using different settings of energy dose and focus, according to a known exposure sequence. As is well known, the known exposure settings can be compared with asymmetry or other properties measured on the metrology targets exposed in those fields, to build up calibration information for the metrology method to be used on real production wafers, and to evaluate performance quality of the measurement method itself.

The process comprises a preselection phase 1002, and an optimization phase 1004.

These calibration wafers are then measured using a scatterometer such as the one shown in FIG. 3, which may be the same metrology tool as will be used in volume production, or one with similar capabilities. It is assumed that the scatterometer or other instrument can be controlled so as to measure all locations across the whole target with a full range of wavelengths, and using polarized and unpolarized illumination, which are all parameters controllable through the metrology recipe in the method of FIG. 9.

Within the preselection phase 1002 in step 1010, each target is measured with a sparse wavelength sampling, at locations across the FEM wafer, using polarization 0, 90 and both. A "high dynamic range" acquisition mode may be needed, as it expected that the whole target will show large variations of diffraction efficiency and, therefore, large variations of intensity, according to the progressive variation of geometric parameters.

In step 1012, the data acquired during the step 1010 is analyzed at the sample locations (individual pixels or super pixels may be considered) for focus sensitivity and robustness (for example, using the wavelength similarity method disclosed in WO2017/198422, incorporated herein by reference).

In step 1014, the analysis step 1012 is used to identify the best capture conditions, for example polarization and wavelength windows.

Within the optimization phase 1004, at step 1020, a dense measurement through different wavelengths within these best wavelength windows is performed to obtain measurements from locations across the target and across the FEM. The results of the measurement step 1020 are analyzed in step 1022 evaluate a set of key performance indicators (KPI) that determine the best recipe. This analysis can be carried out for all locations across the target area, for example per pixel, or per super-pixel comprising a few pixels joined together.

At step 1024, the results of evaluation in step 1022 are used to define one or more combinations of capture conditions and regions of the target where those capture conditions yield good measurement performance. The definitions of regions and capture conditions are stored to form the focus metrology recipe for the current reticle and process step.

As will be illustrated further below, measurement of focus performance does not have to be done in one image or image pair, but multiple targets, and/or multiple sets of capture conditions can yield good performance when combined. Accordingly, the recipe may define more than one ROI per target, and more than one set of capture conditions.

Figure 11:
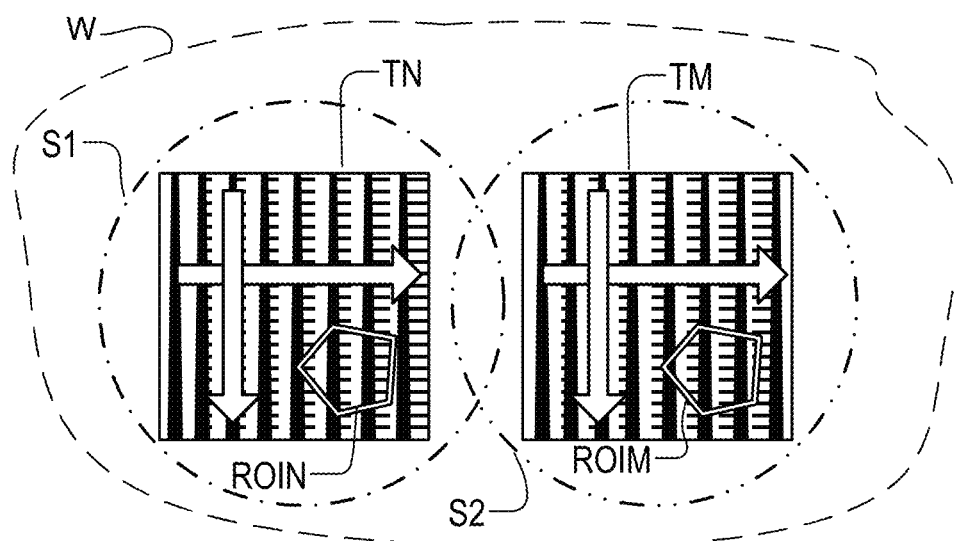
FIG. 11 shows a focus metrology target comprising a two arrays of features including two-dimensional variation of geometric parameters in a repeating pattern, according to a further embodiment of the present invention.

As illustrated in FIG. 11, a focus metrology pattern may include more than one array of features. A first array of features TN and a second array of features TM are printed in the same step, at substantially the same location on the substrate. In practice, multiple targets and multiple pairs of targets can be printed at numerous locations across the substrate, either in scribe lane areas, or among the device features. In this example, the first array of features TN is the same as target T in the example of FIG. 8. The second array of features TM comprises a repeating pattern of features that is substantially the same as the repeating pattern in the first array TN, but mirrored in the first direction of periodicity (X). Unlike the small targets of FIG. 5, these individual patterns may be too large to be imaged simultaneously using radiation spot S in the dark field imaging mode of the inspection apparatus of FIG. 3. Instead, they are captured in successive capture steps by moving the spot to positions S1 and S2, as shown. Measurements of asymmetry as a property of these focus metrology target can be taken by taking first and second images using the +1 and −1 order diffracted radiation collected by the apparatus. The images will each have the same form as the one shown in FIG. 8(*b*). In the case of mirrored targets TN and TM, the selected subset of locations (ROI) will not be optimized independently for each target, but ROIs ROIN and ROIM will comprise measured at corresponding subsets of the locations, as illustrated.

Figure 12:
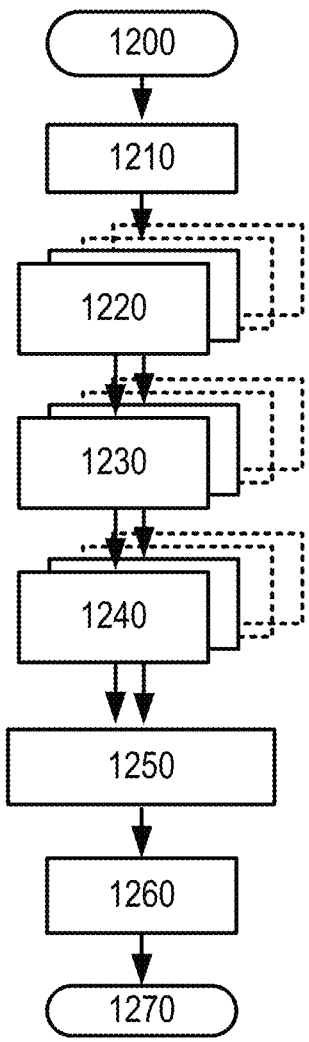
FIG. 12 is a flowchart of a method of monitoring focus using multiple targets according to a further embodiment of the present invention.

FIG. 12 is a flowchart of the steps of a method for measuring focus performance of a lithographic process using the pair of targets illustrated in FIG. 11. The steps 1200 to 1270 are the same as the steps 900-970 in FIG. 9, but with adaptation as follows:

1200—Start by defining a product design or metrology wafer design with one or more pairs of progressive metrology targets, and preparing a suitable set of patterning devices (reticles).

1210—Print one or more mirrored pairs of progressive focus metrology targets alongside product patterns on a substrate, each target comprising an array of features with parameters varying from location to location over the array;

1220—Measure intensity of a portion of the diffraction spectrum of each metrology target using a suitable inspection apparatus (for example the +1 order is a suitable portion of the diffraction spectrum), using multiple acquisition steps (spot positions) if necessary;

1230—Measure intensity of an opposite portion of the diffraction spectrum (for example, −1 order) of each focus metrology target using the inspection apparatus, again using multiple acquisition steps (spot positions) if necessary;

1240—Calculate measurements of asymmetry of focus metrology patterns by comparing the intensities of the opposite diffraction orders, using only a selected subset of locations (ROIN, ROIM) over the target images, the selected subset of locations being defined along with other capture conditions as part of a focus metrology recipe;

1250—Using the asymmetry measurements, with stored calibration curves and/or other measurements such as SEM, calculate focus error at the time of printing the focus metrology pattern.

1260—Use the derived focus measurement in focus setting for exposures on subsequent substrates.

1270—End or repeat with further substrates.

As already explained, step 1220 and step 1230 may be performed as a single step such that the opposite diffraction orders of a focus metrology pattern can be obtained in a single acquisition.

As already explained, asymmetry is not the only property of the targets that may be used in a measurement of focus. Intensity (diffraction efficiency) is another example property that may be measured and used instead of or in combination with asymmetry.

Although the measurement steps are shown being made by a scatterometer, as a dedicated inspection apparatus, this may be a stand-alone apparatus, or it may be integrated in the lithocell. Moreover, asymmetry measurements can be made without dedicated metrology apparatus, for example using suitable targets with the alignment sensors provided in the lithographic apparatus.

Calculation steps 1240 and 1250 can all be performed in a processor of the inspection apparatus, or may be performed in different processors associated with monitoring and control of the lithographic apparatus. Each step may be performed by a programmed processor, and it is an advantage of the techniques disclosed, that the inspection apparatus can be modified to perform the focus measurement methods without hardware modification.

It is a matter of implementation, how to combine the measurements from the different targets, to arrive at a single focus performance measurement. On the one hand, it would be possible to derive a separate focus performance measurement from each target, and then combine them. On the other hand, it would be possible to derive a combined asymmetry measurement from each target, and then derive from that the focus measurement.

In addition to the targets with mirrored features, pairs of targets having other differences can be provided, particularly to enhance coverage of the "target space", being a multidimensional space defined by the set of geometric parameters that can vary from design to design. Accordingly, a focus metrology pattern may include third and/or fourth arrays of features, and these may be processed in parallel with the measurements from the first and (where provided) second array. Processing of these additional measurements is similar to that for the first pair of features, as shown by the dotted steps behind steps 1220-1240 in FIG. 12.

Such an example can include for example two focus metrology patterns Ta and Tb, or two pairs with mirrored features, giving four focus metrology patterns TNa, TNb, TMa and TMb, respectively. These labels are the same as those used in FIG. 5, with the difference that each array is a progressive focus metrology target, rather than a simple periodic array of features. In terms of the above-mentioned target space, each variant of the progressive focus metrology target allows a region of the multi-dimensional target space to be covered, while the conventional grating targets of FIG. 5 allow only specific points in said target space.

These and other examples which combine more than one progressive focus metrology target may be as illustrated in Table 1:

TABLE 1

| Parameters that vary within each target | Parameter that varies from target to target | Number of targets | Total area of targets |
| --- | --- | --- | --- |
| w1 and w3 | w2 | 4 | 4 × 20 × 20 μm2 |
| w2 and w3 | w1 | 4 | 4 × 20 × 20 μm2 |
| w2 and w3 | w1a = a; w1b = P-a | 2 | 2 × 20 × 20 μm2 |
| w1, w2, w3 | The target is mirrored | 2 | 2 × 20 × 20 μm2 |
| CD/pitch, pitch | w2 | 4 | 4 × 20 × 20 μm2 |

Although measurements are expected to be made in a dark field imaging mode, for speed and flexibility, in yet other embodiments, asymmetry of each focus metrology pattern may be measured separately, for example using the pupil imaging branch of the inspection apparatus of FIG. 3, or a more general angle-resolved scatterometer. The opposite diffraction orders from one pattern are located in complementary regions of the pupil image, but only one pattern can be measured at a time.

Figure 13:
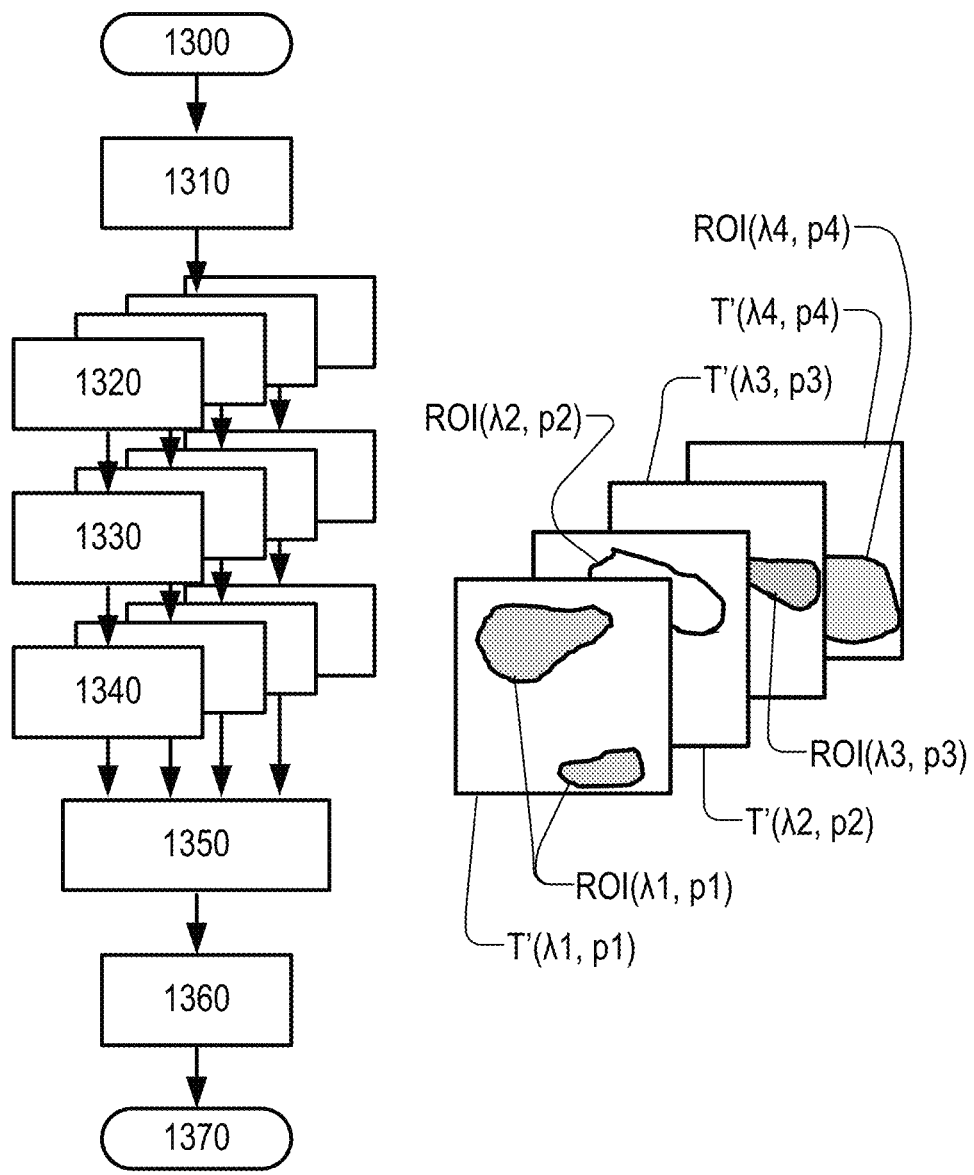
FIG. 13 is a flowchart of a method of monitoring focus using multiple image capture conditions according to a further embodiment of the present invention.

FIG. 13 illustrates a further variation that may be used as an alternative or in addition to the variations illustrated in FIGS. 11 and 12. FIG. 13 is a flowchart of the steps of a method for measuring focus performance of a lithographic process using the pair of targets illustrated in FIG. 11. The steps 1300 to 1370 are the same as the steps 1200-1270 in FIG. 9, but with adaptation as follows:

1300—Start by defining a product design or metrology wafer design with one or more pairs of progressive metrology targets, and preparing a suitable set of patterning devices (reticles).

1310—Print one or more progressive focus metrology targets alongside product patterns on a substrate, each target comprising an array of features with parameters varying from location to location over the array;

1320—Measure intensity of a portion of the diffraction spectrum of each metrology target using a suitable inspection apparatus (for example the +1 order is a suitable portion of the diffraction spectrum), using multiple capture conditions (in terms of wavelength λ1-λ4, polarization p1-p4);

1330—Measure intensity of an opposite portion of the diffraction spectrum (for example, −1 order) of each focus metrology target using the inspection apparatus, again using the same multiple capture conditions (in terms of wavelength λ1-λ4, polarization p1-p4);

1340—Calculate measurements of asymmetry of focus metrology patterns by comparing the intensities of the opposite diffraction orders, using only a selected subset of locations (ROI(λ1, p1) to ROIλ4, λ4)) over the target images, the selected subset of locations being defined along with other capture conditions as part of a focus metrology recipe for each set of capture conditions;

1350—Using the asymmetry measurements, with stored calibration curves and/or other measurements such as SEM, calculate focus error at the time of printing the focus metrology pattern.

1360—Use the derived focus measurement in focus setting for exposures on sub sequent substrates.

1370—End or repeat with further substrates.

Note that, in the optimization process (FIG. 10), the selected subset of locations (ROI) for a focus metrology target it is likely to be different for each set of capture conditions. Accordingly, the use of progressive target designs according to the principles of the present disclosure effectively allows an optimized combination of geometric parameters and capture conditions to be applied in each acquisition step, where a conventional periodic array target can only have one set of geometric parameters for all of the capture conditions.

As already explained, step 1320 and step 1330 may be performed as a single step such that the opposite diffraction orders of a focus metrology pattern can be obtained in a single acquisition. Although the measurement steps are shown being made by a scatterometer, as a dedicated inspection apparatus, this may be a stand-alone apparatus or it may be integrated in the lithocell. Moreover, asymmetry measurements can be made without dedicated metrology apparatus, for example using suitable targets with the alignment sensors provided in the lithographic apparatus.

As already explained, asymmetry is not the only property of the targets that may be used in a measurement of focus. Intensity (diffraction efficiency) is another example property that may be measured and used instead of or in combination with asymmetry.

Calculation steps 1340 and 1350 can all be performed in a processor of the inspection apparatus, or may be performed in different processors associated with monitoring and control of the lithographic apparatus. Each step may be performed by a programmed processor, and it is an advantage of the techniques disclosed, that the inspection apparatus can be modified to perform the focus measurement methods without hardware modification. On the other hand, it will be advantageous if the inspection apparatus is adapted to make rapid multiple acquisitions with different capture conditions.

It is a matter of implementation, how to combine the measurements from the different targets, to arrive at a single focus performance measurement. On the one hand, it would be possible to derive a separate focus performance measurement from each target, and then combine them. On the other hand, it would be possible to derive a combined asymmetry measurement from each target, and then derive from that the focus measurement.

In addition to the mirrored pairs of targets, pairs of targets having other differences can be provided, particularly to enhance coverage of the "target space", being a multidimensional space defined by the set of geometric parameters that can vary from design to design. Accordingly, a focus metrology pattern may include third and/or fourth arrays of features, and these may be processed in parallel with the measurements from the first and (where provided) second array. Processing of these additional measurements is similar to that for the first pair of features, as shown by the dotted steps behind steps 1220-1240 in FIG. 12.

The techniques of FIG. 12 and FIG. 13 can be combined in a single embodiment, to obtain yet further measurements and improve focus measurement performance. In other words, an example having multiple capture conditions, can also include multiple focus metrology patterns Ta and Tb, or two mirrored pairs, giving four focus metrology patterns TNa, TNb, TMa and TMb, respectively. The permutations shown in Table 1 are available, for example, while yet further design variations are possible, as will now be illustrated.

Progressive Target Design Considerations and Variations

Figure 14:
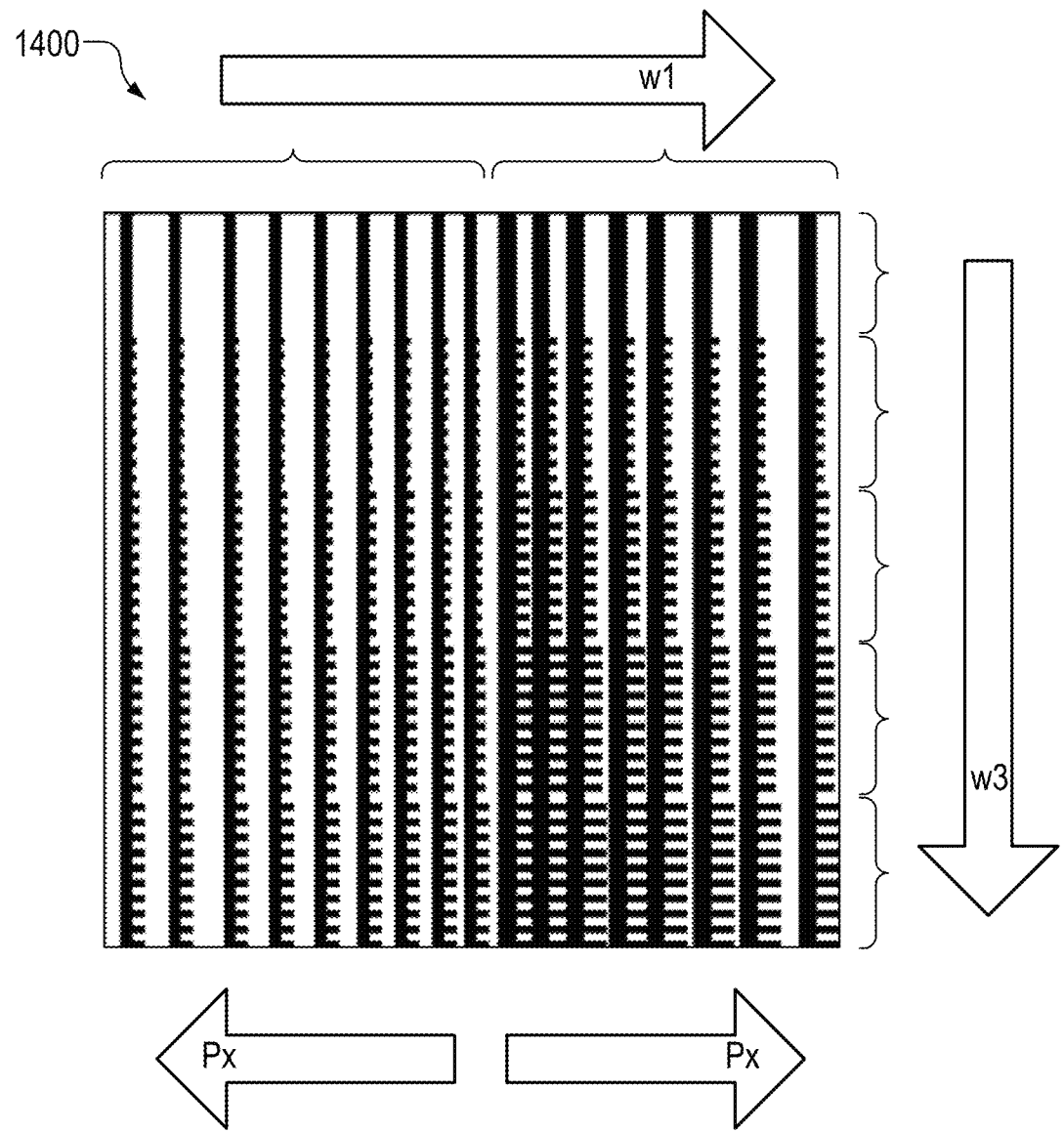
FIG. 14 shows a further example focus metrology target comprising two-dimensional variation of three geometric parameters, according to a further embodiment of the present invention.

Referring now to FIG. 14, another design of progressive focus metrology target 1400 is shown, by way of example only. In target 1400, dimension w1 varies in the first direction of periodicity, but taking two discrete values in different regions. The pitch parameter Px varies progressively in each region, also in the X direction. Dimension w3 varies in the second direction of periodicity, as in the target of FIG. 8. As before, the proportions in this picture, including the number of lines, are not to scale. In this example, however, the variation is in several steps, rather than continuous. It will be understood that continuous variation, particularly in a line thicknesses, maybe difficult to implement within design rules. Even a continuous variation, any repeating structure, may be if the steps are small enough, so that they cannot be resolved in the dark-field imaging system, for example, then they may be regarded as truly continuous. In any case, whether in two steps, ten steps or hundred steps, a progressive change in a parameter may be implemented.

Figure 15:
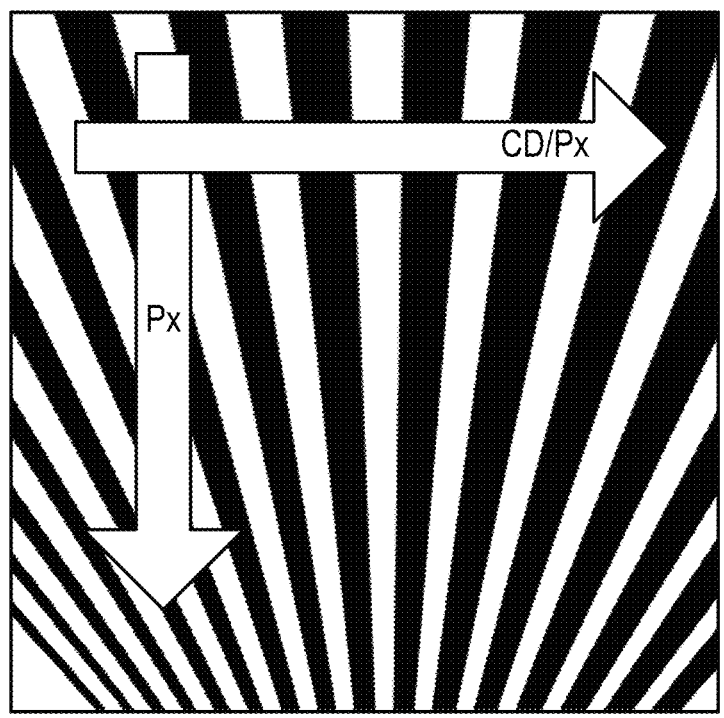
FIG. 15 shows schematically a further example of an array of features for use in focus metrology targets, having two-dimensional variation of pitch and CD parameters.
Figure 16A:
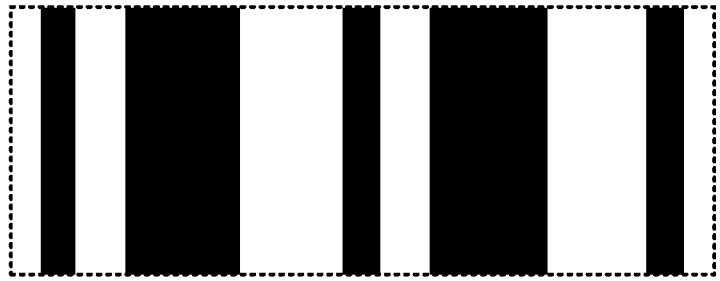
FIGS. 16(a)-16(d) show schematic detail of four further example focus metrology patterns 16(a) to 16(d) for use in embodiments of the invention.
Figure 16B:
Figure 16C:
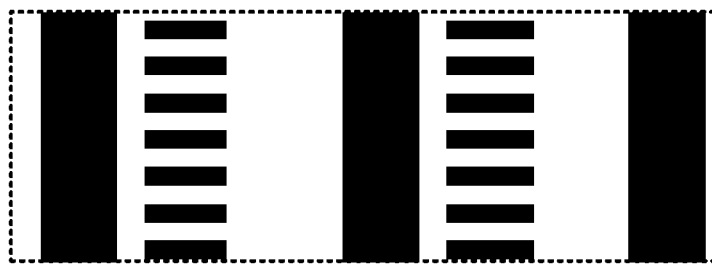
Figure 16D:
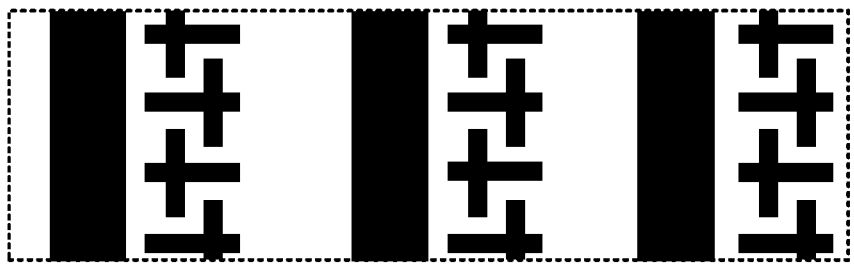

FIG. 15 that geometric parameters other than the dimensions w1, w2, w3 may vary, namely the CD (line width) and pitch, in one or both directions. It will be understood that the drawings are purely schematic, and none of the features is to scale. As mentioned, continuous sloping lines are not generally easy to make in practice. Small stepwise variations in line thicknesses and pitch are therefore likely to be used in a real design.

FIG. 16 shows different examples (a) to (d) of repeating patterns that can be used in place of the one shown in FIG. 4. Example (a) is similar to the one of FIG. 4, without the sub-features (fingers). Example (b) is similar to the one of FIG. 4, and illustrates the symmetry of the black-on-white and white-on-black patterns. Example (c) as the second features entirely comprising fingers, with no solid bar. Example (d) has 2-dimensional structure in the second features. All of these examples are illustrated and described in more detail in the International patent application PCT/EP2018/063959 mentioned above.

Any or all of these parameters can be made to vary across a progressive focus metrology target. Mirrored features and other variations can be envisaged.

FIG. 17 shows two further examples of focus metrology patterns that may be used. These examples are also illustrated and described in more detail in the above-mentioned international patent application PCT/EP2018/063959. In these examples, a focus metrology pattern comprises an array of pairs of features 1722, 1724 that is periodic in at least one direction. Only a small section of the pattern is shown, including a repeating unit with period P. The example of FIG. 5 (a) comprises only one pair of features 1722, 1724 per period. An enlarged view of part of one pair of features is shown in the inset detail, so that certain dimensions can be labeled. The dimensions are measured in the direction of periodicity. A minimum dimension L1, L2 of each feature in the direction of periodicity is close to but not less than a resolution limit of the printing step, when perfectly focused. In the illustrated example, the dimensions L1, L2 of the features within each pair and the dimension of the spacing d between the features within each pair are all of the same order of magnitude. A spacing D between the pairs of features in the direction of periodicity is much greater than both the minimum dimension of each feature and the spacing d between the features within a pair.

Any or all of these parameters can be made to vary in one or two directions across an array of features, to make a progressive focus metrology target for use in the methods of the present disclosure. Mirrored targets and other variations can be envisaged.

Figure 17A:
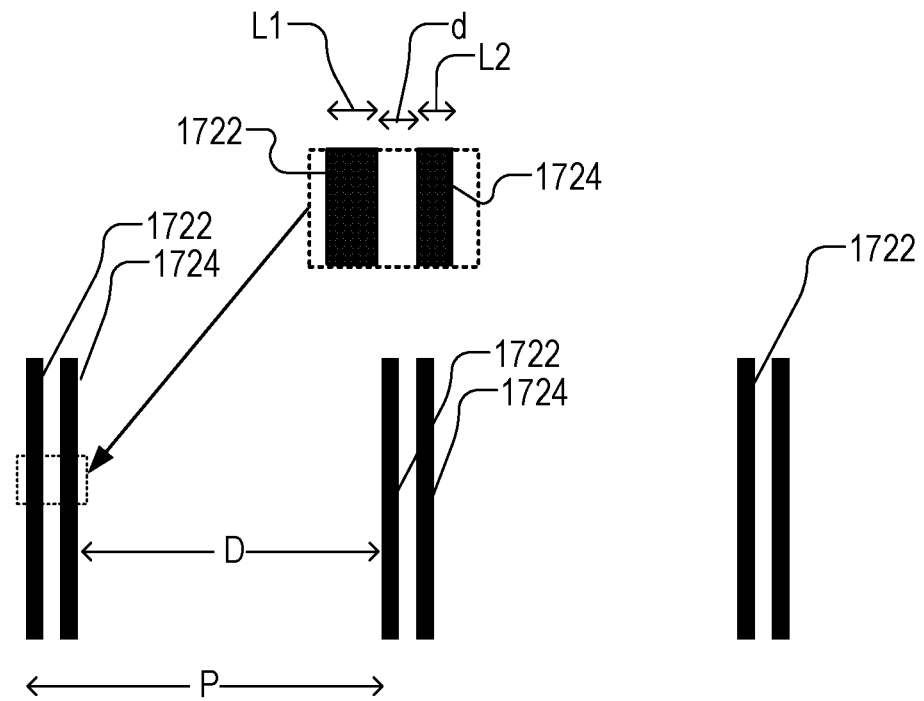
FIGS. 17(a)-17(b) show schematic detail of two example focus metrology patterns 17(a) and 17(b) for use in further embodiments of the invention.
Figure 17B:
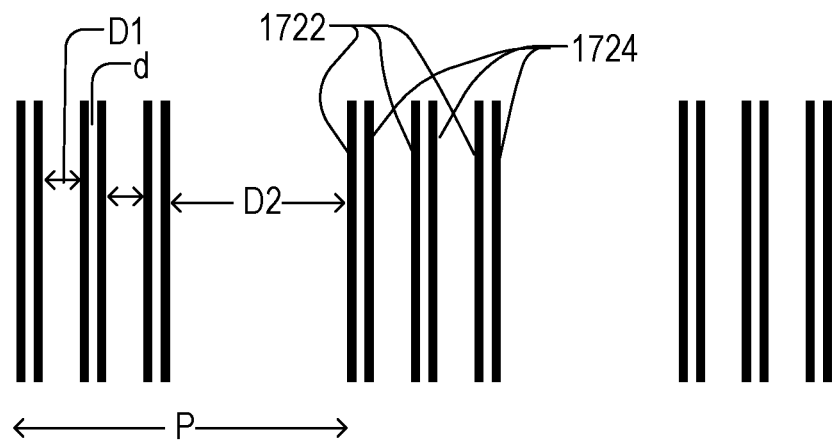

FIG. 17(b) illustrates a pattern that is effectively the same as that in FIG. 17(a), except that a number of pairs of features 1722, 1724 are provided in each period P of the focus metrology pattern. That is to say, the focus metrology pattern in this example comprises a periodic array of groups of pairs of features. The drawing is not to scale. The number of pairs in each group in this example is three, but it could be any number that fits within the period P, and subject to the following constraints. The effect of multiplying the number of pairs is simply to amplify the diffraction signals obtained from the pattern, compared with the single pair pattern shown in FIG. 17(a). Otherwise, the functioning of both patterns is the same. A spacing D1 between adjacent groups of pairs of features within the focus metrology pattern in the direction of periodicity is much greater than the dimensions L1, L2 of each feature 1722, 1724 and much greater than the spacing d between features within a pair. Additionally, the spacing D2 between groups of pairs is much greater than the spacing D1 between the pairs within a group. These parameters, too, can be made to vary in one or two directions across an array of features, to make a progressive focus metrology target for use in the methods of the present disclosure. Mirrored targets and other variations can be envisaged.

As will be described below, patterns of the type illustrated can be printed with focus-dependent asymmetry by a variety of methods. Some of these methods are applicable in reflective (e.g. EUV) projection systems only, while others may be applied in more conventional projection systems. For example, the dimensions L1 and L2 of the features 1722 and 1724 within a pair may be equal, or they may be unequal. An example with unequal dimensions is shown in the inset detail in FIG. 17(a). The same option applies in the pattern of FIG. 17(b). In the case where the dimensions within a pair are unequal, this automatically introduces an asymmetry that can be measured with the inspection apparatus of FIG. 3, for example.

In the case where the dimensions within a pair are equal, a focus-dependent asymmetry can nevertheless be introduced by properties of the printing step. In the case of an EUV lithographic apparatus with the asymmetric illumination and 3-D effects in the reticle as illustrated in the above-mentioned international patent application, incorporated herein by reference.

CONCLUSION

In conclusion, a method of manufacturing devices using the lithographic process can be improved by performing focus measurement methods as disclosed herein, using it to measure processed substrates to measure parameters of performance of the lithographic process, and adjusting parameters of the process (particularly focus) to improve or maintain performance of the lithographic process for the processing of subsequent substrates.

The substrates on which these focus metrology patterns are formed may be production wafers or experimental wafers in product development. They may also be dedicated metrology wafers, for example monitor wafers which are processed intermittently as part of an advance process control (APC) mechanism.

In association with the physical grating structures defining the focus metrology patterns as realized on substrates and patterning devices, an embodiment may include a computer program containing one or more sequences of machine-readable instructions describing a method of designing focus metrology patterns, metrology recipes and/or controlling the inspection apparatus to implement the illumination modes and other aspects of those metrology recipes. This computer program may be executed for example in a separate computer system employed for the design/control process. As mentioned, calculations and control steps may be wholly or partly performed within unit PU in the apparatus of FIG. 3, and/or the control unit LACU of FIG. 2. There may also be provided a non-transitory data storage medium (e.g., semiconductor memory, magnetic or optical disk) having such a computer program stored therein.

Further embodiments are disclosed in the subsequent numbered clauses:

1. A method of measuring focus performance of a lithographic apparatus, the method comprising:
   (a) receiving a substrate upon which a focus metrology pattern has been printed, the printed focus metrology pattern including at least a first array of features in which the features at any location within the array define a pattern that repeats in at least a first direction of periodicity, and at least one geometric parameter of the repeating pattern varies from location to location over the array;
   (b) measuring a property of the printed focus metrology pattern at least at a selected subset of the locations across the array; and
   (c) deriving a measurement of focus performance from said property as measured at the selected subset of the locations measured across the array, whereby the repeating pattern upon which the measurement of focus performance is based has geometric parameters determined partly by selection of said subset of locations within the array.

2. A method as defined in clause 1 wherein the selection of said subset of locations is applied in the deriving step (c), while in the measuring step (b) said property is measured at substantially all locations across the array.

3. A method as defined in clause 1 or 2 wherein step (b) comprises capturing at least one dark-field image of said array, each location within the dark-field image corresponding to a location within the array.

4. A method as defined in clause 1, 2 or 3 wherein at least a first geometric parameter of the repeating pattern varies progressively across at least a first region of the array.

5. A method as defined in any of clauses 1 to 4 wherein at least a first geometric parameter of the repeating pattern varies gradually in a first direction of variation across at least a first region of the array, and wherein at least a second geometric parameter of the repeating pattern varies from location to location across the array.

6. A method as defined in clause 5 wherein said second geometric parameter of the repeating pattern varies in a second direction of variation across the array orthogonal to the first direction of variation.

7. A method as defined in any of clauses 1 to 5 wherein the focus metrology pattern further comprises at least a second array of features, wherein a repeating pattern of features in the second array is substantially the same as the repeating pattern in the first array, but in which certain features in the second array have an asymmetry in the first direction of periodicity which is opposite to an asymmetry of corresponding features in the first array, and wherein the measurement of focus performance is derived in step (c) from said property as measured at corresponding subsets of the locations measured across one or both of the first array and the second array.

8. A method as defined in any of clauses 1 to 7 wherein the focus metrology pattern further comprises at least a third array of features, a repeating pattern of features in the third array being either different in form to the repeating pattern in the first array, or being similar in form but encompassing different locations in a target space defined by geometric parameters of the repeating pattern, the measurement of focus performance being derived in step (c) from said property as measured at a selected subset of the locations measured across one or both of the first array and the third array.

9. A method as defined in clause 8 wherein the focus metrology pattern further comprises at least a fourth array of features, features in the repeating pattern of the fourth array being substantially the same as in the repeating pattern in the third array, but mirrored in the first direction of periodicity, the measurement of focus performance being derived in step (c) from said property as measured at corresponding subsets of the locations measured across both of the third array and the fourth array.

10. A method as defined in any of clauses 7 to 9 wherein step (b) comprises capturing at least one dark-field image of each array of features, each location within the dark-field image corresponding to a location within the corresponding array of features, and in step (c) measurements from dark field images of two or more arrays of features are combined to derive the measurement of focus performance.

11. A method as defined in any of clauses 1 to 10 wherein the geometric parameter or geometric parameters that vary across the first array and/or differ between the first array and one or more other arrays include one or more of: the pitch of the repeating pattern in the first direction of periodicity; the pitch of the repeating pattern in a second direction orthogonal to the first direction of periodicity; a dimension of width of a feature within the repeating pattern; a spacing between features in the repeating pattern.

12. A method as defined in any of clauses 1 to 11 wherein the step (b) comprises measuring the property of the or each array of features more than once, under different capture conditions, and in step (c) the measurements of said property made under different capture conditions are combined to derive the measurement of focus performance 13. A method as defined in clause 12 wherein said different capture conditions differ in illumination wavelength and/or polarization.

14. A method as defined in clause 13 or 14 wherein the selected subset of locations within the or each array is different for the measurements made under different capture conditions.

15. A method as defined in any of clauses 1 to 14 wherein the property measured in step (b) is asymmetry.

16. A method as defined in clause 15 wherein the asymmetry is measured by measuring asymmetry in a diffraction spectrum of the selected locations in the array of features.

17. A method as defined in any of clauses 1 to 15 wherein within the or each array of features, a minimum dimension of the features is close to but not less than a resolution limit of the printing of the focus metrology pattern on the substrate being received in step (a).

18. A method as defined in any of clauses 1 to 17 wherein the measurement in step (b) is performed using radiation having a wavelength much longer than said minimum dimension of the features.

19. A method as defined in any of clauses 1 to 18 wherein step (a) further comprises, as a preliminary step, printing the focus metrology pattern on the substrate using a lithographic apparatus.

20. A method as defined in clause 19 wherein said focus metrology pattern is printed on the substrate along with one or more device patterns.

21. A patterning device for use in a lithographic apparatus, the patterning device comprising portions that define one or more device patterns and portions that define one or more metrology patterns, the metrology patterns including at least one focus metrology pattern, the focus metrology pattern comprising at least a first array of features in which the features at any location within the array define a pattern that repeats in at least a first direction of periodicity, and at least one geometric parameter of the repeating pattern varies from location to location over the array, whereby measurement of focus performance using repeating patterns having different geometric parameters can be performed by measuring a property of the printed focus metrology pattern using a selected subset of the locations across the array.

22. A patterning device as defined in clause 21 wherein at least a first geometric parameter of the repeating pattern varies progressively across at least a first region of the array.

23. A patterning device as defined in clause 21 or 22 wherein at least a first geometric parameter of the repeating pattern varies gradually in a first direction of variation across at least a first region of the array, and wherein at least a second geometric parameter of the repeating pattern varies from location to location across the array.

24. A patterning device as defined in clause 23 wherein said second geometric parameter of the repeating pattern varies in a second direction of variation across the array orthogonal to the first direction of variation.

25. A patterning device as defined in any of clauses 21 to 24 wherein the focus metrology pattern further comprises at least a second array of features, a repeating pattern of features in the second array being substantially the same as the repeating pattern in the first array, but mirrored in the first direction of periodicity.

26. A patterning device as defined in any of clauses 21 to 25 wherein the focus metrology pattern further comprises at least a third array of features, a repeating pattern of features in the third array being either different in form similar in form to the repeating pattern in the first array, or being similar in form but encompassing different locations in a target space defined by geometric parameters of the repeating pattern.

27. A patterning device as defined in clause 26 wherein the focus metrology pattern further comprises at least a fourth array of features in the repeating pattern of the fourth array being substantially the same as in the repeating pattern in the third array, but mirrored in the first direction of periodicity.

28. A patterning device as defined in any of clauses 21 to 27 wherein the geometric parameter or geometric parameters that vary across the first array and/or differ between the first array and one or more other arrays include one or more of: the pitch of the repeating pattern in the first direction of periodicity; the pitch of the repeating pattern in a second direction orthogonal to the first direction of periodicity; a dimension of width of a feature within the repeating pattern; a spacing between features in the repeating pattern.

29. A patterning device as defined in any of clauses 21 to 28 wherein the repeating pattern in the or each array has asymmetry in said first direction of first direction of periodicity.

30. A combination of two or more patterning devices as defined in any of clauses 21 to 28, device patterns being different between the patterning devices of the set, the focus metrology pattern being the same between the different patterning devices.

31. A method of determining a metrology recipe for use in controlling a lithographic apparatus, the method comprising:
   (a) receiving measurements of a property of a plurality of focus metrology patterns, said focus metrology pattern having been printed by a lithographic apparatus multiple times on one or more substrates with programmed focus offsets, the printed focus metrology pattern including at least a first array of features in which the features at any location within the array define a pattern that repeats in at least a first direction of periodicity, and at least one geometric parameter of the repeating pattern varies from location to location over the array, said measurements of the property having been made at multiple locations across the array of each printed focus metrology pattern; and
   (b) based on the property measured at the multiple locations and on knowledge of the focus offsets applied in printing each focus metrology pattern, determining an optimal subset of the locations measured across the array, and storing information identifying the selected subset as part of a metrology recipe to be used for measurement of focus performance on subsequent substrates undergoing similar processing.

32. A method as defined in clause 31 wherein the received measurements include measurements of the property of the or each array of feature made under different capture conditions, and in step (b) based on the property measured at the multiple locations and on knowledge of the multiple capture conditions, and on knowledge of the focus offsets applied in printing each focus metrology pattern, determining one or more optimal combinations of capture conditions and subsets of locations measured across the array, and storing information identifying the selected combinations as part of a metrology recipe to be used for measurement of focus performance on subsequent substrates undergoing similar processing.

33. A method as defined in clause 32 wherein said different capture conditions differ in illumination wavelength and/or polarization.

34. A method as defined in clause 32 or 33 wherein said metrology recipe defines a combination of measurements made under different capture conditions and using different selected subsets of locations to be used to derive measurements of focus performance.

35. A method as defined in clause 32 or 33 wherein said metrology recipe defines different subsets of locations within the or each array for measurements made under different capture conditions.

36. A method as defined in any of clauses 31 to 35 wherein step (a) further comprises as a preliminary step receiving said one or more substrates and performing said measurements on said plurality of focus metrology patterns.

37. A method as defined in clause 36 wherein step (a) further comprises, as a preliminary step, printing the focus metrology patterns on the one or more substrates using a lithographic apparatus and using said programmed focus offsets.

38. A method as defined in any of clauses 31 to 37 wherein the steps (a) and (b) are repeated for a further patterning device, the further patterning device defining different device patterns and the same focus metrology pattern.

39. A metrology apparatus for measuring focus performance of a lithographic process, the metrology apparatus being operable to perform steps (a) and (b) of the method of any of clauses 1 to 20.

40. An apparatus for determining a metrology recipe, the metrology apparatus being operable to perform steps (a) and (b) of the method of any of clauses 31 to 38.

41. A lithographic system comprising:
a lithographic apparatus comprising:
an illumination optical system arranged to illuminate a patterning device;
a projection optical system arranged to project an image of the patterning device onto a substrate; and
a metrology apparatus according to clause 39,
wherein the lithographic apparatus is arranged to use the measurement of focus performance derived by the metrology apparatus when applying the pattern to further substrates.

42. A computer program product comprising processor readable instructions which, when run on suitable processor controlled apparatus, cause the processor controlled apparatus to perform steps (b) and/or (c) the method of any of clauses 1 to 20.

43. A computer program comprising processor readable instructions which, when run on suitable processor controlled apparatus, cause the processor controlled apparatus to perform steps (a) and/or (b) the method of any of clauses 31 to 38.

44. A method of manufacturing devices wherein a device pattern is applied to a series of substrates using a lithographic process, the method including:
using the method of any of clauses 1 to 20 to measure focus performance of the lithographic process, and controlling the lithographic process for later substrates in accordance with the measured focus performance.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The breadth and scope of the present invention should not be limited by any of the above-described exemplary embodiments, but should be defined only in accordance with the following claims and their equivalents.

The invention claimed is:

1. A method of measuring focus performance of a lithographic apparatus, the method comprising:
(a) receiving a substrate having a focus metrology pattern printed thereon, the printed focus metrology pattern including at least a first array of features, wherein the features at any location of a plurality of locations within the first array define a pattern that repeats in at least a first direction of periodicity, and wherein at least one geometric parameter of the repeating pattern varies from location to location over the first array;
(b) measuring a property of the printed focus metrology pattern at least at a selected subset of the plurality of locations across the first array; and
(c) deriving a measurement of focus performance from the property as measured at the selected subset of the locations measured across the first array, whereby the repeating pattern upon which the measurement of focus performance is based has geometric parameters determined partly by selection of the subset of locations within the first array.

2. The method of claim 1, wherein the selection of the subset of locations is applied in the deriving step (c), while in the measuring step (b) the property is measured at substantially all locations across the first array.

3. The method of claim 1, wherein step (b) comprises capturing at least one dark-field image of the first array, each location within the dark-field image corresponding to a location within the first array.

4. The method of claim 1, wherein at least a first geometric parameter of the repeating pattern varies progressively across at least a first region of the first array.

5. The method of claim 1, wherein at least a first geometric parameter of the repeating pattern varies gradually in a first direction of variation across at least a first region of the first array, and wherein at least a second geometric parameter of the repeating pattern varies from location to location across the first array.

6. A method of claim 5, wherein the second geometric parameter of the repeating pattern varies in a second direction of variation across the first array orthogonal to the first direction of variation.

7. The method of claim 1, wherein the focus metrology pattern further comprises at least a second array of features, wherein a repeating pattern of features in the second array is substantially the same as the repeating pattern in the first array, wherein certain features in the second array have an asymmetry in the first direction of periodicity that is opposite to an asymmetry of corresponding features in the first array, and wherein the measurement of focus performance is derived in step (c) from the property as measured at corresponding subsets of the locations measured across one or both of the first array and the second array.

8. The method of claim 1, wherein step (b) comprises capturing at least one dark-field image of each array of features, each location within the dark-field image corresponding to a location within the corresponding array of features, and in step (c) measurements from dark field images of two or more arrays of features are combined to derive the measurement of focus performance.

9. The method of claim 1, wherein the geometric parameter or geometric parameters that vary across the first array and/or differ between the first array and one or more other arrays include one or more of: the pitch of the repeating pattern in the first direction of periodicity; the pitch of the repeating pattern in a second direction orthogonal to the first direction of periodicity; a dimension of width of a feature within the repeating pattern; a spacing between features in the repeating pattern.

10. A method of manufacturing devices wherein a device pattern is applied to a series of substrates using a lithographic process, the method including:
using the method of claim 1, to measure focus performance of the lithographic process, and
controlling the lithographic process for later substrates in accordance with the measured focus performance.

11. A patterning device for use in a lithographic apparatus, the patterning device comprising:
portions that define one or more device patterns; and
portions that define one or more metrology patterns,
wherein the metrology patterns include at least one focus metrology pattern, the focus metrology pattern comprising at least a first array of features in which the features at any location of a plurality of locations within the first array define a pattern that repeats in at least a first direction of periodicity, and at least one geometric parameter of the repeating pattern varies from location to location over the first array, whereby measurement of focus performance using repeating patterns having different geometric parameters can be performed by measuring a property of the printed focus metrology pattern using a selected subset of the locations across the first array.

12. A method of determining a metrology recipe for use in controlling a lithographic apparatus, the method comprising:
(a) receiving measurements of a property of a plurality of focus metrology patterns, the focus metrology pattern having been printed by a lithographic apparatus multiple times on one or more substrates with programmed focus offsets, the printed focus metrology pattern including at least a first array of features in which the features at any location of a plurality of locations within the first array define a pattern that repeats in at least a first direction of periodicity, and at least one geometric parameter of the repeating pattern varies from location to location over the first array, the measurements of the property having been made at multiple locations across the first array of each printed focus metrology pattern; and
(b) based on the property measured at the multiple locations and on knowledge of the focus offsets applied in printing each focus metrology pattern, determining an optimal subset of the locations measured across the first array, and storing information identifying the selected subset as part of a metrology recipe to be used for measurement of focus performance on subsequent substrates undergoing similar processing.

13. A metrology apparatus for measuring focus performance of a lithographic process, the metrology apparatus being operable to:
receive a substrate having a focus metrology pattern printed thereon, the focus metrology pattern including an array of features, wherein features in the array of features at any location of a plurality of locations define a repeating pattern that repeats in at least a first direction of periodicity, and wherein at least one geometric parameter of the repeating pattern varies from location to location over the array of features;
measure a property of the focus metrology pattern at least at a selected subset of the plurality of locations across the array of features; and
derive a measurement of focus performance from the property as measured at the selected subset of the locations measured across the array of features, whereby the repeating pattern upon which the measurement of focus performance is based has geometric parameters determined partly by selection of the subset of locations within the array of features.

14. A lithographic system comprising:
a lithographic apparatus comprising:
an illumination optical system arranged to illuminate a patterning device;
a projection optical system arranged to project an image of the patterning device onto a substrate; and
a metrology apparatus according to claim 13,
wherein the lithographic apparatus is arranged to use the measurement of focus performance derived by the metrology apparatus when applying the pattern to further substrates.

15. A system comprising:
a substrate having a focus metrology pattern printed thereon, the focus metrology pattern including an array of features, wherein features in the array of features at any location of a plurality of locations define a repeating pattern that repeats in at least a first direction of periodicity, and wherein at least one geometric parameter of the repeating pattern varies from location to location over the array of features; and
a non-transitory computer program product comprising processor readable instructions which, when run on suitable processor controlled apparatus, cause the processor controlled apparatus to:
measure a property of the focus metrology pattern at least at a selected subset of the plurality of locations across the array of features; and
derive a measurement of focus performance from the property as measured at the selected subset of the locations measured across the array of features, whereby the repeating pattern upon which the measurement of focus performance is based has geometric parameters determined partly by selection of the subset of locations within the array of features.

* * * * *